(12) United States Patent
Nishimura et al.

(10) Patent No.: US 10,763,298 B2
(45) Date of Patent: Sep. 1, 2020

(54) PHOTOELECTRIC CONVERSION APPARATUS AND IMAGE PICKUP SYSTEM

(71) Applicant: CANON KABUSHIKI KAISHA, Tokyo (JP)

(72) Inventors: Yu Nishimura, Kawasaki (JP); Sho Suzuki, Yokohama (JP); Yasushi Matsuno, Fujisawa (JP); Yusuke Onuki, Fujisawa (JP); Masahiro Kobayashi, Tokyo (JP); Takashi Okagawa, Sagamihara (JP); Yoshiyuki Nakagawa, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 264 days.

(21) Appl. No.: 15/792,607

(22) Filed: Oct. 24, 2017

(65) Prior Publication Data

US 2018/0122852 A1 May 3, 2018

(30) Foreign Application Priority Data

Oct. 28, 2016 (JP) .................................. 2016-212128
Oct. 4, 2017 (JP) .................................. 2017-194427

(51) Int. Cl.
*H01L 27/148* (2006.01)
*H01L 27/146* (2006.01)

(52) U.S. Cl.
CPC .. *H01L 27/14818* (2013.01); *H01L 27/14623* (2013.01); *H01L 27/14625* (2013.01);
(Continued)

(58) Field of Classification Search
CPC ......... H01L 27/14818; H01L 27/14812; H01L 27/14806; H01L 27/148; H01L 27/14825;
(Continued)

(56) References Cited

U.S. PATENT DOCUMENTS 4,581,619 A * 4/1986 Mizutome ................. B41J 2/445
347/136
4,982,079 A * 1/1991 Yagyu ............... H01L 27/14665
250/208.1
(Continued)

FOREIGN PATENT DOCUMENTS

JP 2001-144280 A 5/2001
JP 2010-045114 A 2/2010
(Continued)

*Primary Examiner* — John R Lee
(74) *Attorney, Agent, or Firm* — Canon U.S.A., Inc. IP Division

(57) ABSTRACT

A photoelectric conversion apparatus includes a plurality of units each including a charge generation region disposed in a semiconductor layer. Each of a first unit and a second unit of the plurality of units includes a charge storage region configured to store charges transferred thereto from the charge generation region, a dielectric region located above the charge generation region and surrounded by an insulator layer, and a first light-shielding layer covering the charge storage region that is located between the insulator layer and the semiconductor layer, and the first light-shielding layer having an opening located above the charge generation region. The charge generation region of the first unit is able to receive light through the opening of the first light-shielding layer. The charge generation region of the second unit is covered with a second light-shielding layer.

32 Claims, 23 Drawing Sheets

(52) U.S. Cl.
CPC .. *H01L 27/14636* (2013.01); *H01L 27/14683* (2013.01); *H01L 27/14843* (2013.01)

(58) Field of Classification Search
CPC ......... H01L 27/14843; H01L 27/14837; H01L 27/1485; H01L 27/14856; H01L 27/14623; H01L 27/14625; H01L 27/1462; H01L 27/14601; H01L 27/146; H01L 27/1463; H01L 27/14636; H01L 27/14683
See application file for complete search history.

(56) References Cited

U.S. PATENT DOCUMENTS

| | | | | |
|---|---|---|---|---|
| 5,061,979 | A * | 10/1991 | Kobayashi | H01L 27/14665 136/244 |
| 5,086,218 | A * | 2/1992 | Yagyu | H01L 27/14665 250/208.1 |
| 5,160,835 | A * | 11/1992 | Yagyu | H01L 27/14665 250/208.1 |
| 5,448,097 | A * | 9/1995 | Mizushima | H01L 27/14623 257/435 |
| 5,521,639 | A | 5/1996 | Tomura | |
| 6,081,018 | A * | 6/2000 | Nakashiba | H01L 31/02162 257/232 |
| 6,707,066 | B2 * | 3/2004 | Morishita | G01T 1/2018 257/222 |
| 6,946,638 | B2 * | 9/2005 | Kuwazawa | H01L 27/14609 250/208.1 |
| 7,053,427 | B2 * | 5/2006 | Tanigawa | H01L 27/14601 257/294 |
| 7,683,407 | B2 * | 3/2010 | Boettiger | H01L 27/14625 257/292 |
| 8,878,264 | B2 * | 11/2014 | Velichko | H01L 21/26586 257/215 |
| 8,928,784 | B2 * | 1/2015 | Watanabe | H01L 31/18 348/272 |
| 9,257,480 | B2 * | 2/2016 | Zhao | H01L 27/14812 |
| 9,373,732 | B2 * | 6/2016 | Velichko | H01L 31/02327 |
| 9,466,639 | B2 * | 10/2016 | Tsukagoshi | H01L 27/14629 |
| 2006/0060899 | A1 | 3/2006 | Hong | |
| 2008/0142919 | A1 * | 6/2008 | Shin | H01L 27/14623 257/435 |
| 2009/0065815 | A1 | 3/2009 | Naya | |
| 2010/0001178 | A1 | 1/2010 | Koshiba | |
| 2010/0288911 | A1 | 11/2010 | Mizuta | |
| 2011/0037854 | A1 * | 2/2011 | Godaiin | H01L 27/14621 348/164 |
| 2011/0227182 | A1 | 9/2011 | Aoki | |
| 2012/0049305 | A1 | 3/2012 | Takami | |
| 2012/0147208 | A1 | 6/2012 | Otsuka | |
| 2012/0188431 | A1 | 7/2012 | Takimoto | |
| 2012/0199927 | A1 | 8/2012 | Shimotsusa | |
| 2016/0021284 | A1 | 1/2016 | Tezuka | |
| 2016/0381310 | A1 * | 12/2016 | Lenchenkov | H04N 5/359 348/302 |
| 2018/0122852 | A1 * | 5/2018 | Nishimura | H01L 27/14843 |

FOREIGN PATENT DOCUMENTS

| | | |
|---|---|---|
| JP | 2012-156334 A | 8/2012 |
| JP | 2013-143610 A | 7/2013 |

* cited by examiner

PXL

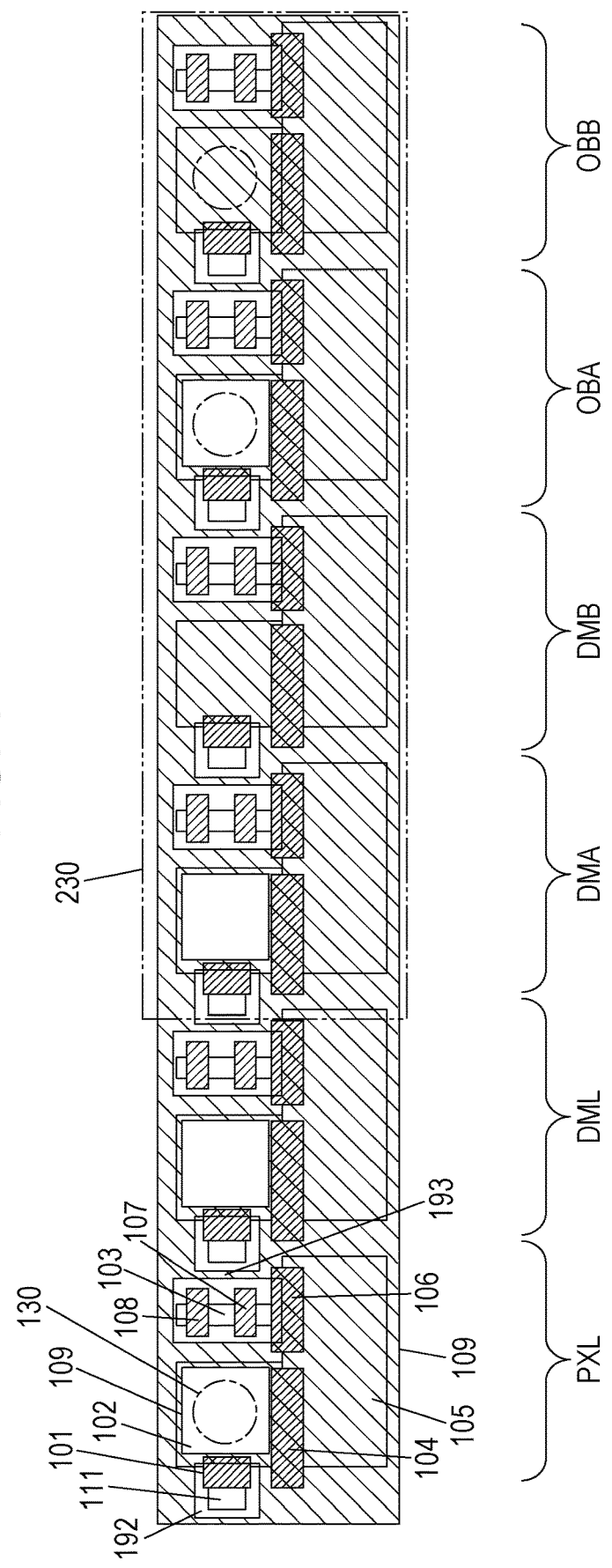

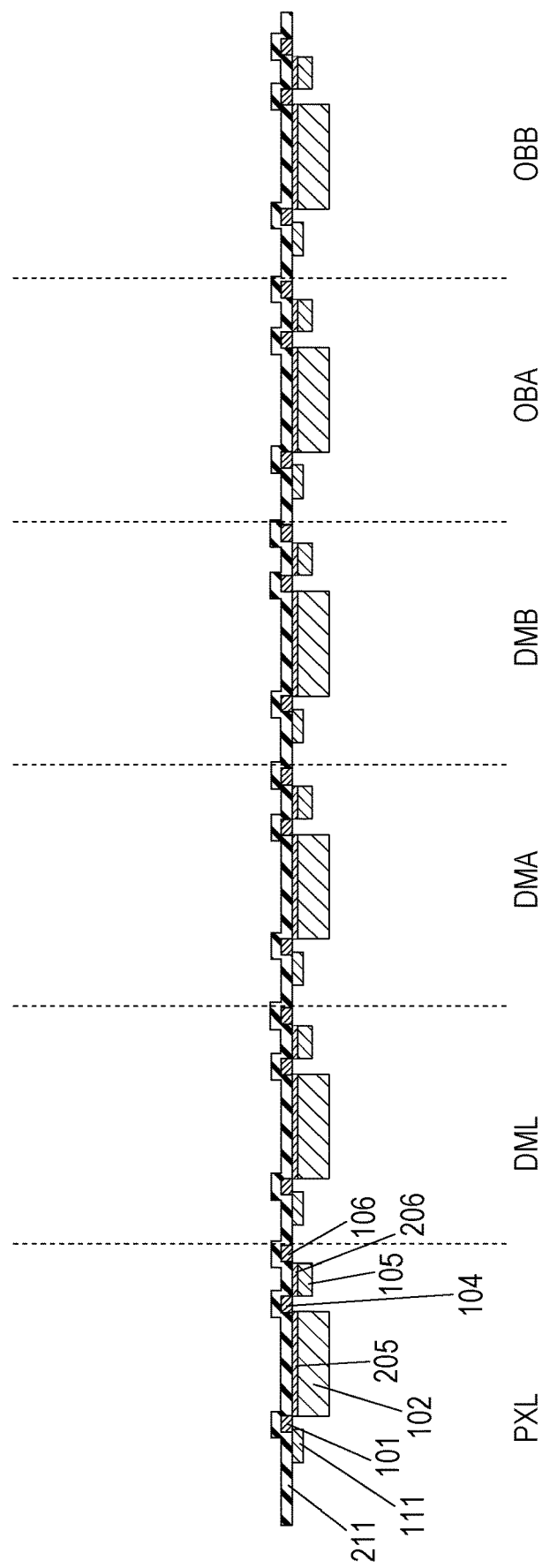

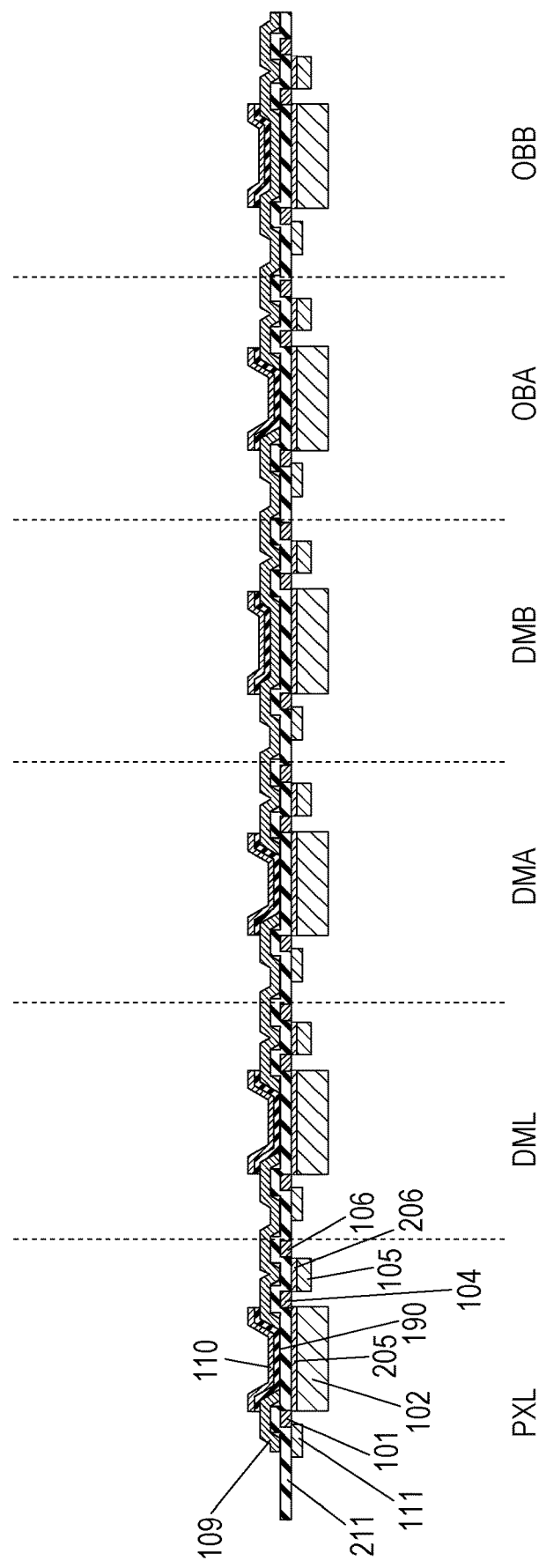

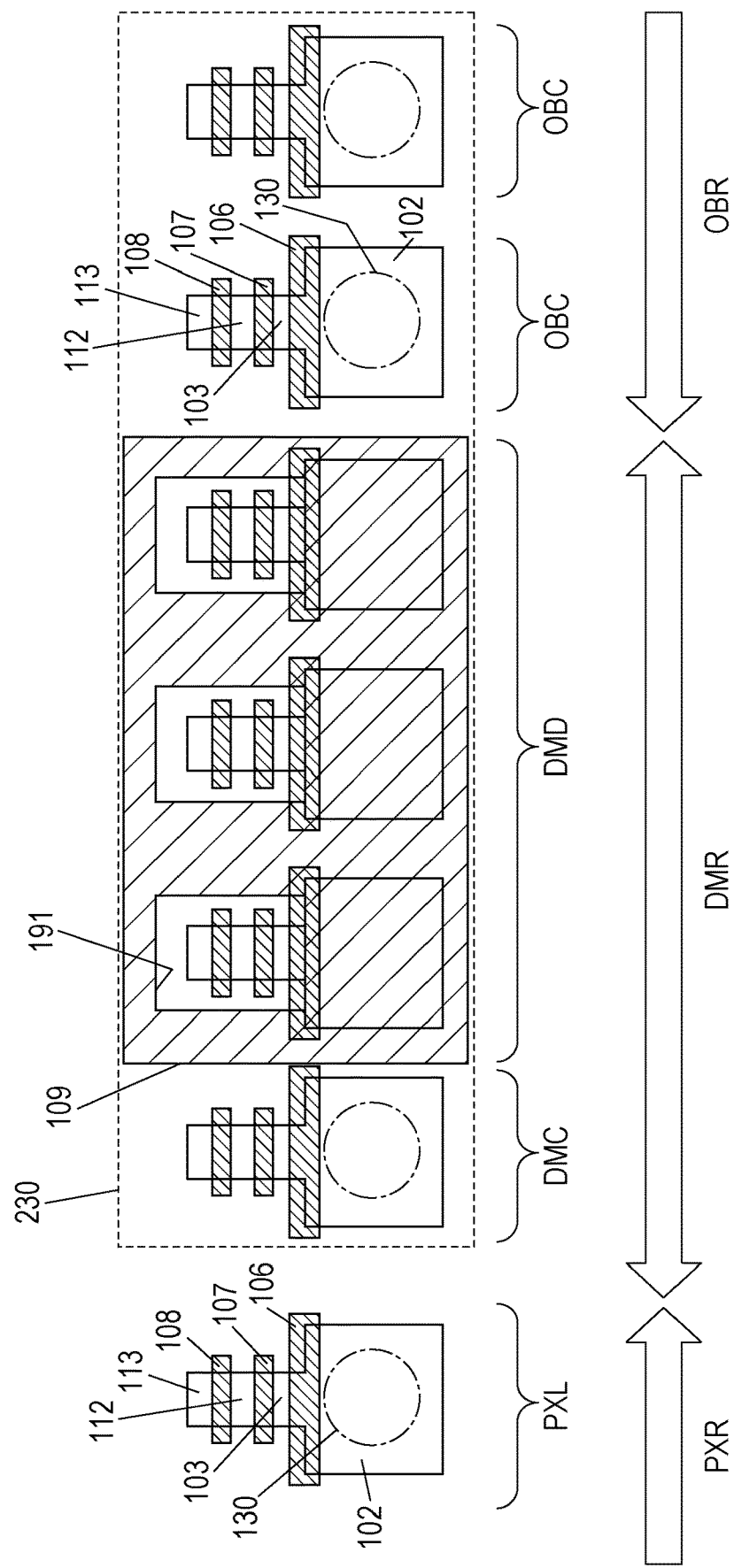

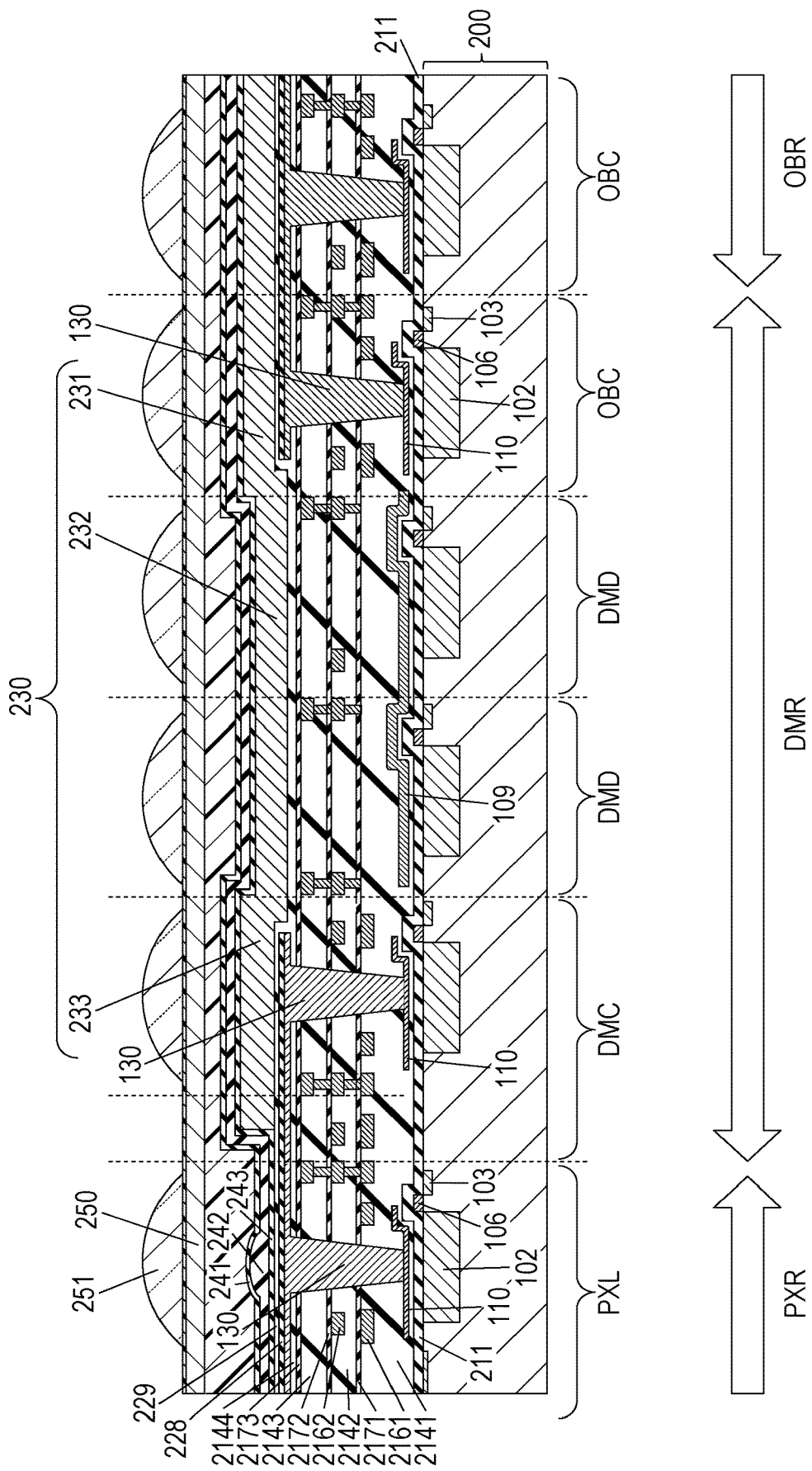

PHOTOELECTRIC CONVERSION APPARATUS AND IMAGE PICKUP SYSTEM

BACKGROUND OF THE INVENTION

Field of the Invention

The present invention relates to a light-shielding layer in a photoelectric conversion apparatus.

Description of the Related Art

Photoelectric conversion apparatuses correct signals from pixels each including a photoelectric conversion unit that receives light by using signals from pixels each including a photoelectric conversion unit that is shielded against light so as to implement black-level correction. Pixels each including a photoelectric conversion unit that receives light are referred to as effective pixels or light-receiving pixels, and pixels each including a photoelectric conversion unit that is shielded against light are referred to as optical black (OB) pixels or light-shielded pixels.

An optical waveguide is disposed above a photoelectric conversion unit in both of an effective pixel region and an OP pixel region of a solid-state image pickup device according to a first embodiment described in Japanese Patent Laid-Open No. 2012-156334. A light-shielding film is disposed between the optical waveguide and the photoelectric conversion unit in the OB pixel region.

A solid-state image pickup device according to a fourth embodiment described in Japanese Patent Laid-Open No. 2012-156334 has a global shutter function. A light-shielding film is disposed above a charge accumulation unit in both of the effective pixel region and the OB pixel region of the solid-state image pickup device. The light-shielding film extends above a photoelectric conversion unit in the OB pixel region.

SUMMARY OF THE INVENTION

A first aspect of the present disclosure provides a photoelectric conversion apparatus including a plurality of units each including a charge generation region disposed in a semiconductor layer. Each of a first unit of the plurality of units and a second unit of the plurality of units includes a charge storage region configured to store charges transferred thereto from the charge generation region, a dielectric region located above the charge generation region and surrounded by an insulator layer, and a first light-shielding layer covering the charge storage region that is located between the insulator layer and the semiconductor layer, and the first light-shielding layer having an opening located above the charge generation region. The first unit is configured so that the charge generation region of the first unit is able to receive light through the opening of the first light-shielding layer, and the charge generation region of the second unit is covered with a second light-shielding layer.

A second aspect of the present disclosure provides a photoelectric conversion apparatus including a first unit and a second unit. Each of the first unit and the second unit includes a first impurity region of n-type disposed in a semiconductor layer, a second impurity region of n-type disposed in the semiconductor layer, charges being transferred from the first impurity region to the second impurity region, a dielectric region located above the first impurity region and surrounded by an insulator layer, and a first light-shielding layer covering the second impurity region between the insulator layer and the semiconductor layer, and the first light-shielding layer having an opening located above the first impurity region. The first unit is configured so that the first impurity region of the first unit is able to receive light through the opening of the first shielding layer. The second unit is configured so that the first impurity region of the second unit is covered with a second light-shielding layer.

A third aspect of the present disclosure provides a photoelectric conversion apparatus including a plurality of units each including a charge generation region disposed in a semiconductor layer. Each of a first unit and a second unit of the plurality of units includes a charge detection region configured to detect charges transferred thereto from the charge generation region, and a dielectric region located above the charge generation region and surrounded by an insulator layer. In an intermediate region located between the first unit and the second unit, the semiconductor layer is covered with a first light-shielding layer located between the insulator layer and the semiconductor layer, and an area of the semiconductor layer covered with the first light-shielding layer is greater than an area of the charge generation region. The intermediate region and the charge generation region of the second unit are covered with a second light-shielding layer located on a side of the insulator layer opposite to the semiconductor layer.

Further features of the present invention will become apparent from the following description of exemplary embodiments with reference to the attached drawings.

BRIEF DESCRIPTION OF THE DRAWINGS

FIG. 4 is a schematic plan view of a photoelectric conversion apparatus.

FIGS. 6A to 6C are schematic cross-sectional views illustrating a fabrication method of a photoelectric conversion apparatus.

FIG. 11 is a schematic plan view of a photoelectric conversion apparatus.

FIG. 12 is a schematic cross-sectional view of the photoelectric conversion apparatus.

DESCRIPTION OF THE EMBODIMENTS

In the process of studying a combination of a light-guiding path (optical waveguide) and a global shutter function, the inventors have found that the black-level correction accuracy achieved by the technique of Japanese Patent Laid-Open. No. 2012-156334 is not high enough. Because of this issue, the technique of Japanese Patent Laid-Open No. 2012-156334 fails to increase the quality (image quality, for example) of a signal resulting from black-level correction. Accordingly, the present disclosure provides a photoelectric conversion apparatus capable of obtaining a signal of good quality.

Embodiments of the present invention will be described below with reference to the accompanying drawings. In the description and drawings given below, each component illustrated in common in a plurality of drawings is denoted by the same reference sign. Therefore, such a common component is described with reference to a plurality of drawings, and a description of the component denoted by the same reference sign is appropriately omitted.

Figure 1A:
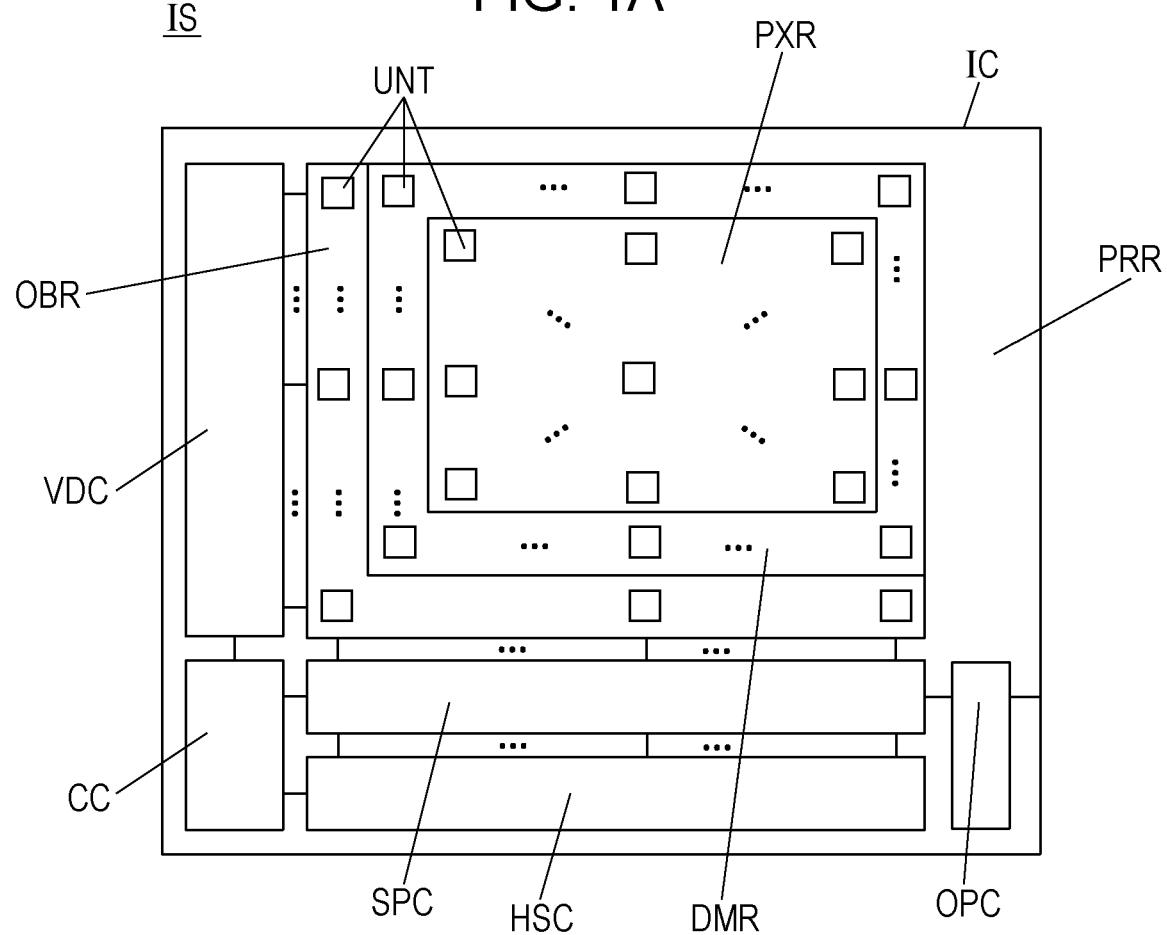
FIGS. 1A and 1B are schematic diagrams respectively illustrating a photoelectric conversion apparatus and an image pickup system.

A configuration of a photoelectric conversion apparatus IS will be described with reference to FIG. 1A. The photoelectric conversion apparatus IS includes a plurality of pixel units UNT in a semiconductor chip IC. Each of the plurality of pixel units UNT includes a charge generation unit disposed in a semiconductor layer. The pixel units UNT are disposed in a light-receiving region PXR and a light-shielded region OBR of the photoelectric conversion apparatus IS. The pixel units UNT include not only main units each for generating basic information of a corresponding pixel in an image obtained by the photoelectric conversion apparatus IS but also sub units that are units having a configuration similar to that of the main units. The main units are light-receiving units disposed in the light-receiving region PXR, and the sub units are light-shielded units disposed in the light-shielded region OBR. Note that an intermediate region DMR may be provided between the light-receiving region PXR and the light-shielded region OBR as illustrated in an example of FIG. 1A. In this example, the pixel units UNT are also disposed in the intermediate region DMR. The pixel units (dummy units) disposed in the intermediate region DMR are also the sub units. The photoelectric conversion apparatus IS can include a peripheral region PRR on the outer side of a pixel region where the pixel units UNT are disposed.

Figure 1B:
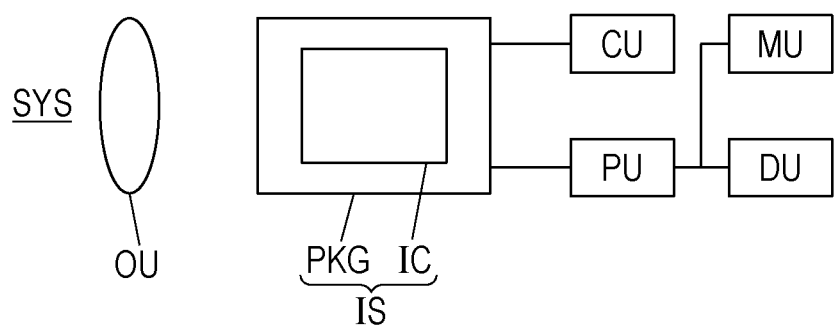

FIG. 1B illustrates an example of a configuration of an image pickup system SYS including the photoelectric conversion apparatus IS. The image pickup system SYS can further include at least one of an optical system OU, a control device CU, a processing device PU, a display device DU, and a memory device MU. Details of the image pickup system SYS will be described later.

First Embodiment

A first embodiment of the photoelectric conversion apparatus IS will be described with reference to FIGS. 2A to 3C.

Figure 2A:
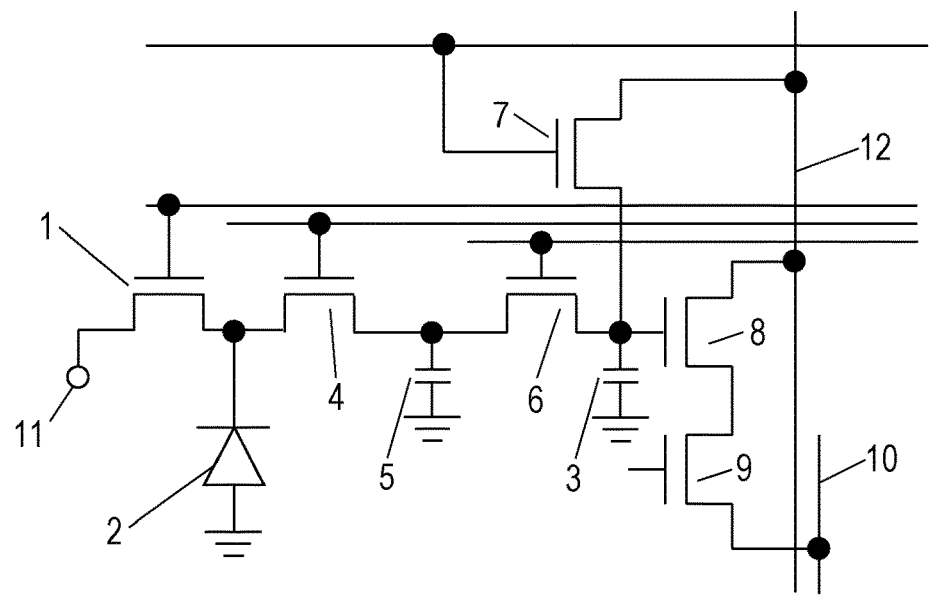
FIGS. 2A and 2B are schematic diagrams illustrating a configuration of a pixel unit.

FIG. 2A is an example of a circuit diagram of each pixel unit UNT. The pixel unit UNT can include a charge generation unit 2, a charge storage unit 5, a charge detection unit 3, and a charge output unit 11 which constitute a pixel circuit. A signal based on charges at the charge detection unit 3 is output to a signal output line 10 from the pixel unit UNT. The pixel circuit of the pixel unit further includes controllers configured to switch between connection (transfer) and disconnection (non-transfer) of the individual units that handle the charges or configured to amplify a signal. Specific examples of the controllers include a first transfer gate 4, a second transfer gate 6, a third transfer gate 1, a reset transistor 7, an amplification transistor 8, and a selection transistor 9. Each of the first transfer gate 4, the second transfer gate 6, and the third transfer gate 1 is a metal-oxide semiconductor (MOS) gate. Each of the reset transistor 7, the amplification transistor 8, and the selection transistor 9 is a metal-oxide semiconductor field-effect transistor (MOSFET). The charge generation unit 2, the charge storage unit 5, the charge detection unit 3, and the charge output unit 11 can be regarded as a source and/or a drain of a transistor having the corresponding transfer gate as the gate thereof.

The charge generation unit 2 is capable of generating signal charges that are based on an amount of light received thereby. Note that the charge generation unit 2 generates noise charges serving as a dark current even if no light is incident thereto owing to a light-shielding layer. A photodiode can be used as the charge generation unit 2. The charge storage unit 5 is connected to the charge generation unit 2 via the first transfer gate 4. The charge storage unit 5 functions as a grounded capacitor and temporarily accumulates the charges transferred thereto from the charge generation unit 2. The charge detection unit 3 converts the charges transferred thereto from the charge storage unit 5 into a voltage signal. The charge detection unit 3 includes an impurity region disposed in a semiconductor layer and has a capacitance including a parasitic capacitance that occurs at this node. The impurity region of the charge detection unit 3 is a floating diffusion (FD) region. The charge detection unit 3 is connected to the charge storage unit 5 via the second transfer gate 6. The charge detection unit 3 is also connected to a source of the reset transistor 7 and a gate of the amplification transistor 8. A power supply voltage is supplied to a drain of the amplification transistor 8 from a power supply line 12. The power supply voltage is also supplied to a drain of the reset transistor 7 from the power supply line 12. The amplification transistor 8 constitutes a source-follower circuit. When the reset transistor 7 is set to an ON state, the voltage of the charge detection unit 3 is reset to a reset voltage (power supply voltage in this case). At that time, a reset signal based on the reset voltage is output to a source of the amplification transistor 8.

When the second transfer gate 6 is set to the ON state, the charges are transferred from the charge storage unit 5 to the charge detection unit 3. The charge detection unit 3 then outputs a signal voltage based on the amount of transferred charges to the source of the amplification transistor 8.

The source of the amplification transistor 8 is connected to a drain of the selection transistor 9. A source of the selection transistor 9 is connected to the signal output line 10. When the selection transistor 9 is set to the ON state, a reset signal or a pixel signal is output to the signal output line 10. In this way, a signal from a pixel is read out.

The charge generation unit 2 is further connected to the charge output unit 11 via the third transfer gate 1. When the third transfer gate 1 is set to the ON state, the charges accumulated in the charge generation unit 2 are output to the charge output unit 11. An impurity region of the charge output unit 11 is an overflow drain (OFD) region. The charge output unit 11 is supplied with a voltage with which the charges transferred thereto from the charge generation unit 2 are successfully eliminated. In this embodiment, the power supply voltage is supplied to the charge output unit 11 from the power supply line 12. This connection is not illustrated in FIG. 2A.

An electronic shutter (global electronic shutter) for simultaneously setting a predetermined exposure period for all the pixels is implemented by simultaneously outputting the charges to the charge output unit 11 from all the pixels and transferring the charges generated at the charge generation unit 2 to the charge storage unit 5 later. With this function, a variance in the exposure timing due to sequential charge reading from the individual pixels is reduced and, consequently, a distortion of a resultant image is reduced. Note that the pixel circuit for implementing the global electronic shutter and the driving method therefor are not limited to the above-described ones and may be modified variously.

Figure 2B:
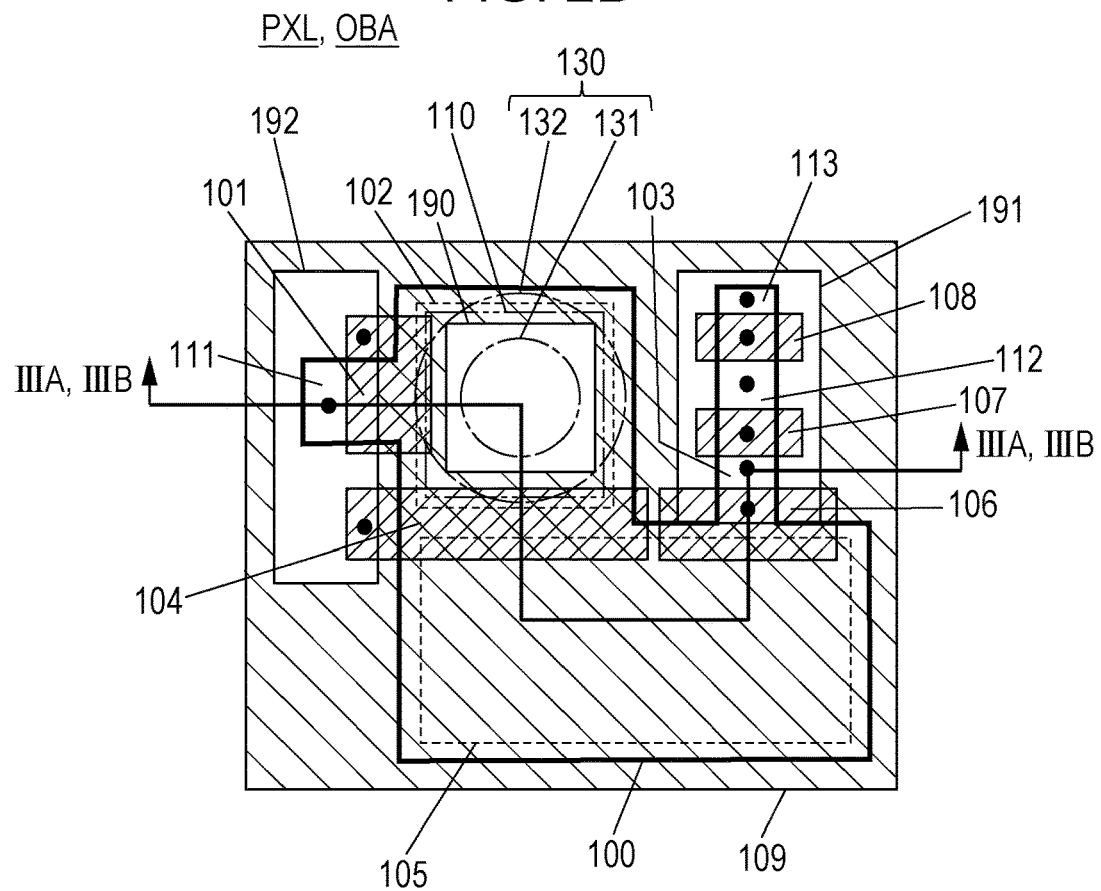

FIG. 2B is a plan view of a portion near a semiconductor layer of the pixel units UNT in the light-receiving region PXR and the light-shielded region OBR in accordance with the first embodiment. Hereinafter, each pixel unit in the light-receiving region PXR is referred to as a light-receiving unit PXL, and each pixel unit in the light-shielded region OBR is referred to as a light-shielded unit OBA.

Correspondences between a circuit component illustrated in FIG. 2A and a structure illustrated in FIG. 2B will be described first. Referring to FIG. 2B, a region outside an element region 100 (active region), which is enclosed by a solid line is an element isolation region composed of an insulator. FIG. 2B illustrates a charge generation region 102 serving as an impurity region of the charge generation unit 2 and a charge storage region 105 serving as an impurity region of the charge storage unit 5. FIG. 2B further illustrates a charge detection region 103 serving as an impurity region of the charge detection unit 3 and a charge output region 111 serving as an impurity region of the charge output unit 11. Since electrons are treated as signal charges in the first embodiment, each of the charge generation region 102, the charge storage region 105, the charge detection region 103, and the charge output region 111 is an n-type impurity region. In the case where holes are treated as signal charges, these impurity regions are impurity regions of the opposite conductivity type, that is, p-type.

FIG. 2B also illustrates a gate electrode 104 serving as the first transfer gate 4, a gate electrode 106 serving as the second transfer gate 6, and a gate electrode 101 serving as the third transfer gate 1. FIG. 2B further illustrates a gate electrode 107 of the reset transistor 7 and a gate electrode 108 of the amplification transistor 8. The gate electrode 104 serving as the first transfer gate 4 is disposed between the charge generation region 102 and the charge storage region 105. The gate electrode 106 serving as the second transfer gate 6 is disposed between the charge storage region 105 and the charge detection region 103. The gate electrode 107 of the reset transistor 7 is disposed to be adjacent to the charge detection region 103. On a side of the gate electrode 107 opposite to the charge detection region 103, an impurity region 112 serving as the drain of the reset transistor 7 is disposed. This impurity region 112 also serves as the drain of the amplification transistor 8. The gate electrode 108 of the amplification transistor 8 is disposed to be adjacent to the impurity region 112. On a side of the gate electrode 108 opposite to the impurity region 112, an impurity region 113 serving as the source of the amplification transistor 8 is disposed. The selection transistor 9 is not illustrated in FIG. 2B. The selection transistor 9 can be disposed on a side of the amplification transistor 8 opposite to the reset transistor 7, for example. The impurity region 113 serving as the source of the amplification transistor 8 can also serve as the source of the selection transistor 9. The gate electrode 101 serving as the third transfer gate 1 is disposed to be adjacent to the charge generation region 102. The gate electrode 101 is disposed on a side of the charge generation region 102 different from a side where the gate electrode 104 is disposed. On a side of the gate electrode 101 opposite to the charge generation region 102, the charge output region 111 constituting part of the charge output unit 11 is disposed. The charge output region 111 serves as a drain of a transistor that has the third transfer gate 1 as the gate thereof.

Each light-receiving unit PXL and each light-shielded unit OBA include a lower light-shielding layer 109 that covers at least the charge storage region 105. In each light-receiving unit PXL and each light-shielded unit OBA, the lower light-shielding layer 109 has an opening 190 above the charge generation region 102. The charge generation region 102 of each light-receiving unit PXL is capable of receiving light coming from a subject through the opening 190. Thus, the charge generation region 102 of each light-receiving unit PXL serves as a photoelectric conversion region. A signal based on signal charges generated in the charge generation region 102 of each light-receiving unit PXL can be processed as an image signal. Although the opening 190 of each light-receiving unit PXL and the opening 190 of each light-shielded unit CPA desirably have the same or substantially the same shape, they may have different shapes. The opening 190 of each light-shielded unit CPA desirably has an area that is more than or equal to 0.8 times as large as an area of the opening 190 of each light-receiving unit PXL and is less than or equal to 1.2 times as large as the area of the opening 190 of the light-receiving unit PXL. These dimensions are based on a fact that if one of two circles has a radius that is more than or equal to 0.9 times as large as a radius of the other and is less than or equal to 1.1 times as large as the radius of the other, the one of the two circle has an area that is approximately more than or equal to 0.8 times as large as the area of the other and is less than or equal to 1.2 times as large as the area of the other. In the first embodiment, the lower light-shielding layer 109 also covers parts of the gate electrodes 104, 106, and 101 in addition to the charge storage region 105. Specifically, the lower light-shielding layer 109 does not cover portions of the gate electrodes 104, 106, and 101 where contact plugs are disposed. With such a configuration, even if gate electrodes composed of polysilicon that transmits visible light therethrough are used, an amount of light incident to a semiconductor layer 200 (FIGS. 3A to 3C) through the gate electrodes is successfully reduced. Further, as is understood from a positional relationship between the outline of the charge generation region 102 and the opening 190 illustrated in FIG. 2B, the area of the opening 190 in plan view is less than the area of the charge generation region 102 in plan view. With this configuration, the lower light-shielding layer 109 also covers a peripheral portion of the charge generation region 102. Consequently, an amount of light incident to the semiconductor layer 200 through the gate electrodes is successfully reduced further.

In each light-receiving unit PXL and each light-shielded unit OBA, the lower light-shielding layer 109 has an opening 191 above the gate electrodes 104, 106, 107, and 108, the charge detection region 103, and the impurity regions 112 and 113. Contact plugs are connected to the gate electrodes 104, 106, 107, and 108, the charge detection region 103, and the impurity regions 112 and 113 via the opening 191. The lower light-shielding layer 109 also has an opening 192 above the gate electrodes 104 and 101 and the charge output region 111. Contact plugs are connected to the gate electrodes 104 and 101 and the charge output region 111 via the opening 192. FIG. 2B illustrates the contact plugs as black dots. The openings 191 and 192 are provided in the lower light-shielding layer 109 separately from the opening 190 to have shapes different from that of the opening 190 so that a plurality of contact plugs are disposed therethrough.

A dielectric region 130 is disposed above the charge generation region 102 to overlap the charge generation region 102 at least partially. In addition, a dielectric film 110 is disposed above the charge generation region 102 so that the dielectric region 130 overlaps the dielectric film 110 at least partially. The dielectric film 110 is located between the dielectric region 130 and the charge generation region 102. Details of the dielectric region 130 and the dielectric film 110 will be described later.

Figure 3A:
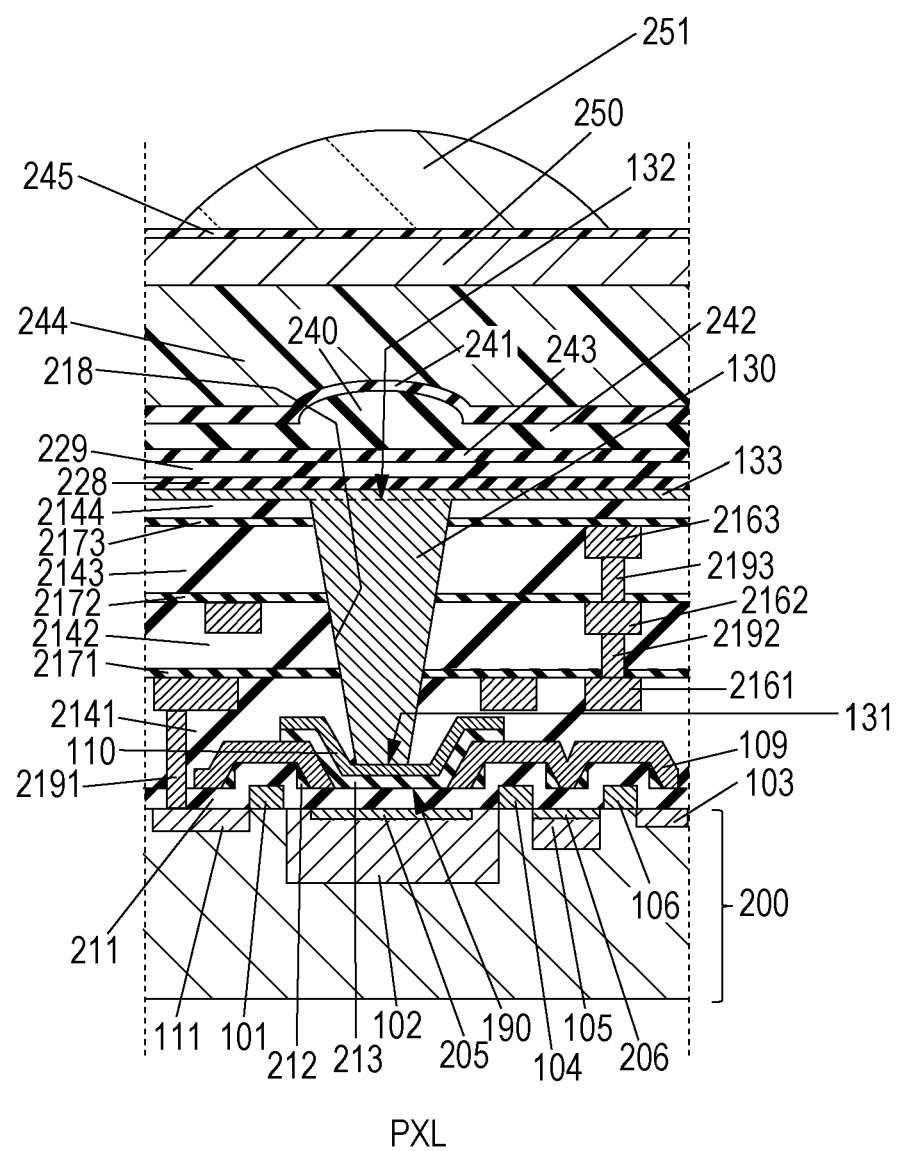
FIGS. 3A to 3C are schematic cross-sectional views of the photoelectric conversion apparatus.
Figure 3B:
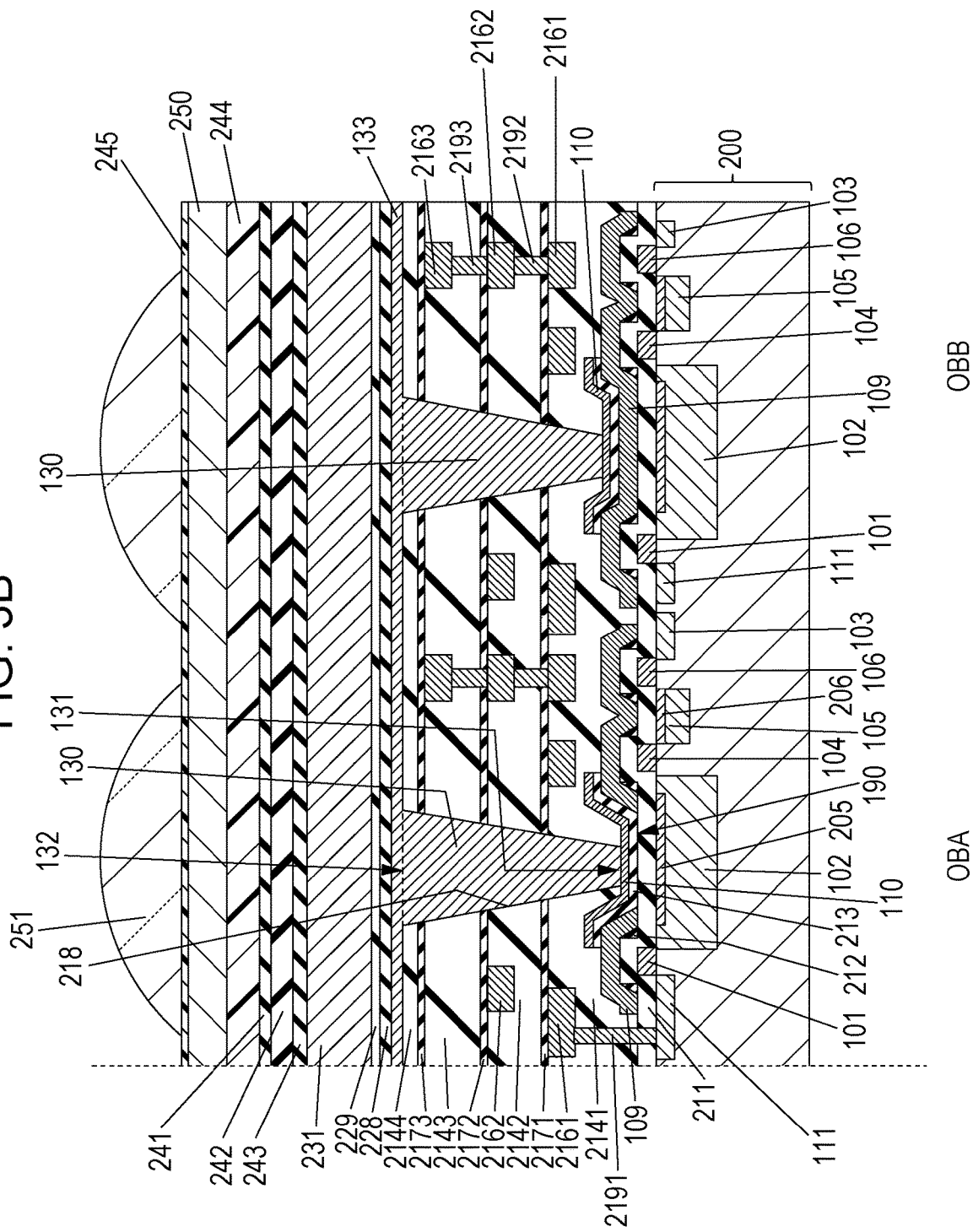
Figure 3C:
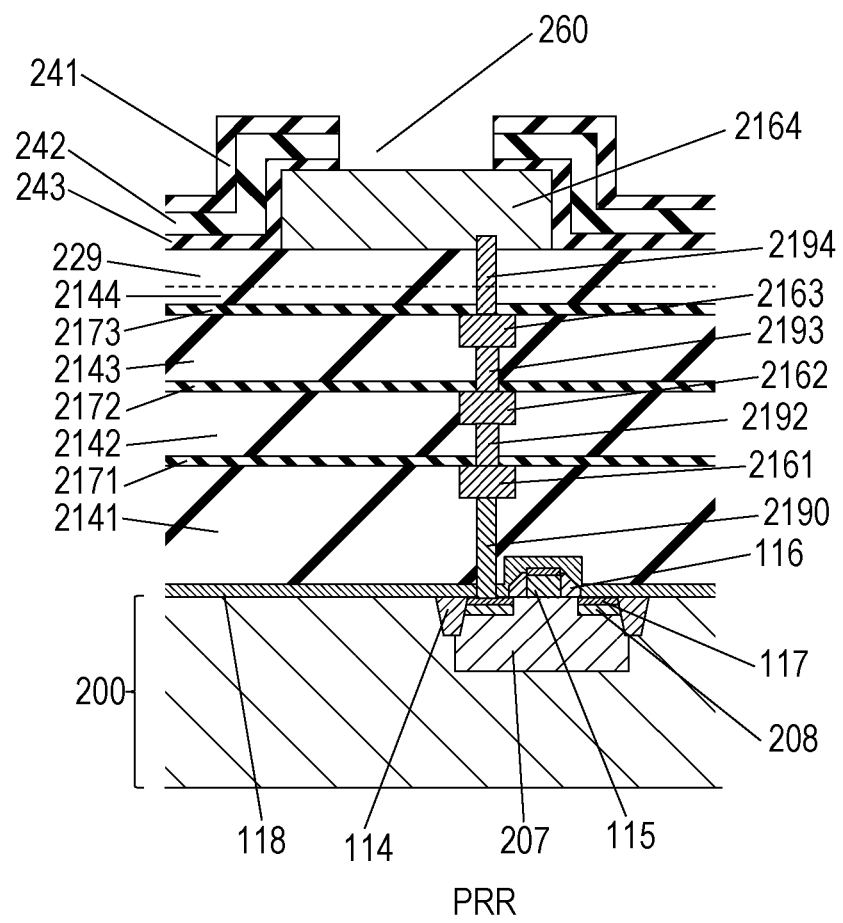

FIGS. 3A and 3B illustrate cross-sectional structures taken along line IIIA-IIIA and line IIIB-IIIB illustrated in FIG. 2B, respectively. FIG. 3C illustrates a cross-sectional structure of the peripheral region PRR illustrated in FIG. 1A.

In the first embodiment, a multilayer wiring structure including wiring layers 2161, 2162, and 2163 and interlayer insulating layers 2141, 2142, 2143, and 2144 is disposed above the semiconductor layer 200. Hereinafter, the wiring layers 2161, 2162, and 2163 are collectively referred to as wiring layers 216X, and the interlayer insulating layers 2141, 2142, 2143, and 2144 are collectively referred to as interlayer insulating layers 214X.

In the first embodiment, the case where the pixel unit UNT includes three wiring layers will be described by way of example. The pixel unit UNT may alternatively include four or more wiring layers or two wiring layers.

Each of the interlayer insulating layers 214X is an insulator layer for insulating a wiring layer from other layers. The interlayer insulating layer 2141 is located between the semiconductor layer 200 and the wiring layer 2161. The interlayer insulating layer 2142 is located between the wiring layer 2161 and the wiring layer 2162. The interlayer insulating layer 2143 is located between the wiring layer 2162 and the wiring layer 2163. Silicon oxide (SiO) having a refractive index of approximately 1.5 can be used for the interlayer insulating layers 214X. The interlayer insulating layers 214X desirably contain silicon (Si), oxygen (O), and hydrogen (H). Hydrogen contained in the interlayer insulating layers 214X is useful for implementing hydrogen termination of the semiconductor layer 200. The interlayer insulating layers 214X can further contain carbon (C). An insulator layer containing silicon (Si), oxygen (O), carbon (C), and hydrogen (H) can have a low dielectric constant (low k) of less than 4.0 or 3.0. The use of a low-dielectric-constant material for the interlayer insulating layers 214X successfully reduces resistive-capacitive (RC) delay of the wiring structure and successfully speeds up the operation.

The lower light-shielding layer 109 is disposed between the interlayer insulating layers 214X and the semiconductor layer 200 and covers the charge storage region 105. In the first embodiment, the lower light-shielding layer 109 is disposed between the semiconductor layer 200 and the interlayer insulating layer 2141, which is disposed between the wiring layer 2161 and the semiconductor layer 200 and through which contact plugs (not illustrated) penetrate.

Each light-receiving unit PXL and each light-shielded unit OBA, OBB include the dielectric region 130 disposed above the charge generation region 102. The dielectric region 130 is surrounded by the interlayer insulating layers 214X disposed above the semiconductor layer 200. The dielectric region 130 has a circular shape in plan view. Alternatively, the dielectric region 130 may have a square, rectangular, elliptic, oval, or polygonal shape in plan view. In particular, the dielectric region 130 is desirably surrounded by the interlayer insulating layers 2142 and 2143 located between the plurality of wiring layers 2161, 2162, and 2163 because a loss of light due to the presence of the wiring layers 2161, 2162, and 2163 is successfully reduced by disposing the dielectric region 130 in the vicinity of the plurality of wiring layers 2161, 2162, and 2163.

The interlayer insulating layers 214X have a hole 218. The dielectric region 130 is located in this hole 218. As a result, the dielectric region 130 is surrounded by the interlayer insulating layers 214X. The dielectric region 130 is desirably formed by filling the hole 218 formed to penetrate through the plurality of interlayer insulating layers 214X of the multilayer wiring structure, with a dielectric material constituting the dielectric region 130. Alternatively, the dielectric region 130 may be formed first, and then the interlayer insulating layers 214X may be formed around the dielectric region 130.

The dielectric region 130 is desirably composed of a material having a refractive index higher than that of a material of the interlayer insulating layers 214X. With such a configuration, light that is obliquely incident to an interface between the dielectric region 130 and each of the interlayer insulating layers 214X at a predetermined angle is totally reflected by the interface. Thus, the light incident to the dielectric region 130 is hindered from leaking to the interlayer insulating layers 214X, and more incident light reaches the charge generation region 102. In this way, the dielectric region 130 constitutes, together with the interlayer insulating layers 214X, a light-guiding path (optical waveguide) having a core-cladding structure. In the light-guiding path, the dielectric region 130 serves as the core and the interlayer insulating layers 214X serve as the cladding. For example, silicon nitride (SiN) having a refractive index of approximately 2.0 can be used as a material of the dielectric region 130. The dielectric region 130 desirably contains silicon (Si), nitrogen (N), and hydrogen (H). Hydrogen contained in the dielectric region 130 is useful for implementing hydrogen termination of the semiconductor layer 200. Note that the materials of the interlayer insulating layers 214X and the dielectric region 130 are not limited to the combination of silicon oxide and silicon nitride. The materials are just required so that the refractive index of the dielectric region 130 is higher than the refractive index of the interlayer insulating layers 214X in order to constitute the light-guiding path, and any given materials can be selected. As the material of the dielectric region 130, silicon oxynitride (SiON) having a refractive index of approximately 1.8 or an organic film material and a material obtained by mixing particles such as titanium oxide to an organic film material may be used. Note that the dielectric region 130 need not necessarily constitute the light-guiding path. The dielectric region 130 may be composed of silicon oxide just like the interlayer insulating layers 214X. An interface between the dielectric region 130 and the interlayer insulating layers 214X optically serves as a barrier and can have a light-guiding function. Since the dielectric region 130 penetrating through the plurality of interlayer insulating layers 214X can reduce the number of interfaces located up to the charge generation region 102, such a configuration is effective to increase the sensitivity.

The dielectric region 130 serving as the light-guiding path has a function of condensing the incident light to the charge generation region 102. Since the amount of light that is incident to the charge generation region 102 increases owing to the dielectric region 130 in the light-receiving unit PXL, the sensitivity increases compared with the case where the dielectric region 130 is absent. In particular, in the case where the charge generation region 102 is small or a lens of a camera that employs an image pickup apparatus has a large F-number, the sensitivity sometimes decreases. However, the influence of this decrease can be reduced by providing the dielectric region 130.

The interlayer insulating layers 214X may be constituted by stacked films composed of different materials. In such a case, the dielectric region 130 is configured such that the refractive index of the dielectric region 130 is higher than refractive indices of the interlayer insulating layers therearound. The dielectric region 130 has a forward tapered shape in which the diameter decreases from the sight-incident surface towards the light-exiting surface. With this shape, a large amount of incident light can be condensed to the charge generation region 102 through the dielectric region 130. The dielectric region 130 may be configured such that the diameter thereof decreases stepwise.

The dielectric film 110 disposed between the dielectric region 130 and the charge generation region 102 can function as an antireflection film that suppresses reflection between the dielectric region 130 and the charge generation region 102. In addition, in the process of fabrication, the dielectric film 110 can function as an etching stop film when the hole 218 is formed.

Further, as is understood from a positional relationship between the outline of the dielectric film 110 and the opening 190 in FIG. 2B, the area of the opening 190 in plan view is smaller than the area of the dielectric film 110 in plan view. With this configuration, the dielectric film 110 also covers an end portion of the lower light-shielding layer 109. As a result, the dielectric film 110 is disposed to extend between the interlayer insulating layer 214X and the lower light-shielding layer 109 and to partially cover the lower light-shielding layer 109 between the dielectric region 130 and the charge generation region 102. The dielectric film 110 can be composed of a material having a refractive index higher than that of the interlayer insulating layers 214X. In particular, the dielectric film 110 desirably has a refractive index higher than that of a portion of the interlayer insulating layers 214X located above the charge storage region 105. With such a structure, light leaking from the dielectric region 130 is successfully hindered from entering the charge storage region 105.

In this embodiment, a distance between the charge storage region 105 and the lower light-shielding layer 109 is smaller than a distance between the dielectric region 130 and the charge generation region 102. With this configuration, a situation cart be avoided where stray light or light exiting from the dielectric region 130 passes through a portion between the lower light-shielding layer 109 and the semiconductor layer 200 and enters the charge storage region 105 and consequently reduces the accuracy of the signal. In this embodiment, since the dielectric film 110 is provided, the dielectric region 130 is provided further from the semiconductor layer 200 than the lower light-shielding layer 109 is provided, by at least a distance equivalent to the thickness of the dielectric film 110.

The lower light-shielding layer 109 covers the charge storage region 105 and has the opening 190 above the charge generation region 102. The dielectric film 110 is disposed to cover the entire charge generation region 102 and part of the lower light-shielding layer 109. In addition, the element isolation region composed of an insulator is disposed outside the portion indicated by the solid-line in FIG. 2B. The lower light-shielding layer 109 is disposed to overlap part of the charge generation region 102 in plan view and has an opening that overlaps another part of the charge generation region 102 in plan view. The lower light-shielding layer 109 is disposed to cover the charge storage region 105 and at least part of the gate electrode 104 of the transistor that transfers charges from the charge generation region 102 to the charge storage region 105. A portion of the lower light-shielding layer 109 that overlaps the charge generation region 102 has a part extending above the gate electrode 104 and a part extending above the gate electrode 101. The lower light-shielding layer 109 suppresses generation of charges in the charge storage region 105 due to incident light and generation of noise by suppressing entry of light to the charge storage region 105. The lower light-shielding layer 109 can be formed by using a material that does not easily transmit visible light therethrough, for example, tungsten, tungsten silicide, tungsten oxide, aluminum, or an alloy film thereof. The lower light-shielding layer 109 desirably has a thickness of 10 nm or greater and 1000 nm or less, for example, a thickness of 100 nm or greater and 200 nm or less. Since portions of the lower light-shielding layer 109 above the gate electrodes and the other portions of the lower light-shielding layer 109 are formed simultaneously, the lower light-shielding layer 109 has an uneven surface resulting from the thicknesses of the gate electrodes.

FIG. 2B illustrates a lower surface 131 and an upper surface 132 of the dielectric region 130. The lower surface 131 of the dielectric region 130 serves as the light-exiting surface, and the upper surface 132 of the dielectric region 130 serves as the light-incident surface. Although the dielectric region 130 is disposed such that the lower surface 131 is entirely included in the charge generation region 102 in plan view in FIG. 2B, the dielectric region 130 is merely required to be disposed such that at least part of the lower surface 131 overlaps the charge generation region 102 in plan view.

Although the dielectric region 130 is disposed such that the lower surface 131 is entirely included in the opening 190 in plan view in this embodiment, the dielectric region 130 is merely required to be disposed such that at least part of the lower surface 131 is located within the opening 190 in plan view. In addition, although the dielectric region 130 is disposed such that the upper surface 132 entirely includes the opening 190 in plan view in this embodiment, the dielectric region 130 is merely required to be disposed such that at least part of the upper surface 132 overlaps the opening 190 in plan view. The width of the dielectric region 130 having a forward tapered shape as in this embodiment is determined by the width of the upper surface 132. Setting the width of the dielectric region 130 to be greater than the width of the opening 190 is effective in terms of increasing the light utilization efficiency. In particular, configuring the lower surface 131 to be entirely included in the opening 190 in plan view and configuring the upper surface 132 to entirely include the opening 190 in plan view are effective in terms of increasing the light utilization efficiency.

A dielectric material film 133 composed of the same material as the material of the dielectric region 130 is disposed above the interlayer insulating layers 214X. In the light-receiving region PXR, the plurality of dielectric regions 130 of the adjacent light-receiving units PXL are interconnected by the dielectric material film 133. Since the dielectric region 130 needs to be surrounded by the interlayer insulating layers 214X, a part of the dielectric material that constitutes the dielectric region 130 and the dielectric material film 133 and that is separate from the upper surface of the interlayer insulating layer 2144 is regarded as the dielectric material film 133. That is, the dielectric region 130 is covered with the dielectric material film 133. For convenience, FIGS. 3A and 3B illustrate a boundary between the dielectric region 130 and the dielectric material film 133 as a dash line. This dash line indicates the aforementioned upper surface 132 of the dielectric region 130. In practical devices, the interface does not need to be present between the dielectric region 130 and the dielectric material film 133. The dielectric material film 133 may be omitted.

A silicon oxynitride layer 228 and an intermediate layer 229 are disposed above the dielectric region 130 with the dielectric material film 133 interposed between the dielectric region 130 and the silicon oxynitride layer 228. The intermediate layer 229 is an inorganic material layer composed of silicon oxide or silicon nitride. The intermediate layer 229 has a function of adjusting a distance between the semiconductor layer 200 and a layer located above the intermediate layer 229. The silicon oxynitride layer 228 functions as an antireflection layer for suppressing reflection between the intermediate layer 229 composed of silicon oxide and the dielectric material film 133 or the dielectric region 130. In each light-receiving unit PXL and each light-shielded unit OBA, the dielectric region 130 is located between the semiconductor layer 200 and the intermediate layer 229 that is an inorganic material layer.

In this embodiment, each light-receiving unit PXL and each light-shielded unit OBA include the dielectric region 130. In addition, the lower light-shielding layer 109 located between the semiconductor layer 200 and the interlayer insulating layers 214X which are insulator layers surrounding the dielectric region 130 has the opening 190 in the light-receiving unit PXL and the light-shielded unit OBA. With such a configuration, a difference in the influences of the dielectric region 130 on the pixel circuit between the light-receiving unit PXL and the light-shielded unit OBA is successfully reduced. Examples of the influences of the dielectric region 130 and the lower light-shielding layer 109 on the pixel circuit include optical influences. For example, when the light utilization efficiency increases as a result of providing the dielectric region 130 in the light-receiving unit PXL compared with the case where the dielectric region 130 is not provided, an amount of light that leaks to a portion below the lower light-shielding layer 109 can also increase. As the lower light-shielding layer 109 becomes closer to the semiconductor layer 200, an interaction between the semiconductor layer 200 and the lower light-shielding layer 109 strengthens.

Examples of the influences of the dielectric region 130 and the lower light-shielding layer 109 on the pixel circuit include electrical influences. In particular, when the dielectric constant of the dielectric region 130 differs from the dielectric constant of the interlayer insulating layers 214X surrounding the dielectric region 130, a dielectric constant above the charge generation region 102 changes depending on whether the dielectric region 130 is located above the charge generation region 102 or the insulator layer is located above the charge generation region 102 instead of the dielectric region 130. As a result, an electrostatic capacitance (parasitic capacitance, for example) of the pixel circuit can change depending on whether the opening 190 is present and whether the dielectric region 130 is present.

Examples of the influences of the dielectric region 130 and the lower light-shielding layer 109 on the pixel circuit include physical or chemical influences. In particular, some of the physical or chemical influences are a difference in an interface state due to hydrogen termination depending on whether the opening 190 is present and whether the dielectric region 130 is present and a difference in defect density due to etching damage produced when the opening 190 and the dielectric region 130 are formed. These differences are differences in an atomic level of the semiconductor layer 200. Such an atomic level difference can greatly influence an output signal from the pixel circuit in charge-handling regions, such as the charge generation region 102, the charge storage region 105, and the charge detection region 103.

In this embodiment, the light-receiving unit PXL and the light-shielded unit OBA can have the same or substantially the same structure from the semiconductor layer 200 to the intermediate layer 229 as illustrated in FIGS. 3A and 3B. In particular, the lower light-shielding layer 109 has the openings 190 above the respective charge generation regions 102 in both of the light-receiving region PXR and the light-shielded region OBR, and both of the light-receiving region PXR and the light-shielded region OBR have a structure including the dielectric region 130 and the dielectric film 110. Thus, there is substantially no difference in the amount of hydrogen supplied to the charge generation region 102 due to hydrogen sintering effect between the light-shielded region OBR and the light-receiving region PXR, or the difference is very small. In addition, there is substantially no difference in the degree of damage on the charge generation region 102 during fabrication between the light-receiving region PXR and the light-shielded region OBR, or the difference is very small. Thus, a difference in the properties of the charge generation region 102 between the light-receiving unit PXL and the light-shielded unit OBA is successfully reduced.

Each light-shielded unit OBA in the light-shielded region OBR includes an upper light-shielding layer 231 that shields the charge generation region 102 against light. The upper light-shielding layer 231 is disposed to be farther from the semiconductor layer 200 than the lower light-shielding layer 109. That is, the distance between the upper light-shielding layer 231 and the semiconductor layer 200 is greater than the distance between the lower light-shielding layer 109 and the semiconductor layer 200. The light-shielded unit OBA and a light-shielded unit OBB include the upper light-shielding layer 231. The opening 190 of the lower light-shielding layer 109 is located between the charge generation region 102 and the upper light-shielding layer 231. With this configuration, the charge generation region 102 of the light-shielded unit OBA is shielded against light by the upper light-shielding layer 231 even if the lower light-shielding layer 109 has the opening 190. Thus, a reference signal for black-level correction is successfully obtained from each light-shielded unit OBA.

The upper light-shielding layer 231 is composed of a light-shielding material, for example, a metal material or an organic material having a low transmittance (of 10% or lower) such as a black material. The material of the upper light-shielding layer 231 desirably has a high reflectance for light of a wavelength from 400 nm to 600 nm. In this embodiment, the upper light-shielding layer 231 is composed mainly of aluminum. The upper light-shielding layer 231 is disposed to overlap the entire surface of the charge generation region 102 in the light-shielded region OBR. The upper light-shielding layer 231 is desirably disposed all over the light-shielded region OBR. Note that the upper light-shielding layer 231 may serve as a wiring that delivers a power supply voltage or a signal.

The main constituent of the lower light-shielding layer 109 and the main constituent of the wiring layer 2161 located at a lower part may differ from each other because a material suitable for the wiring layer 2161 and a material suitable for the lower light-shielding layer 109 differ from each other. Likewise, the main constituent of the upper light-shielding layer 231 and the main constituent of the wiring layer 2163 at an upper part may differ from each other because a material suitable for the upper light-shielding layer 231 and a material suitable for the wiring layer 2163 differ from each other. In this embodiment, the main constituent of the lower light-shielding layer 109 is tungsten, the main constituent of the upper light-shielding layer 231 is aluminum, and the main constituent of the wiring layers 2161, 2162, and 2163 is copper.

In this embodiment, the upper light-shielding layer 231 is disposed above the dielectric region 130. That is, the dielectric region 130 is located between the upper light-shielding layer 231 and the charge generation region 102. With such a configuration, a difference in the influence of the presence of the dielectric region 130 on the charge generation region 102 is successfully reduced between the light-receiving unit PXL and the light-shielded unit OBA because the upper light-shielding layer 231 disposed above the dielectric region 130 hardly influences the dielectric region 130 and the charge generation region 102.

The upper light-shielding layer 231 is disposed on the intermediate layer 229. That is, in the light-shielded unit OBA, the intermediate layer 229 that is an inorganic material layer is located between the upper light-shielding layer 231 and the dielectric region 130.

The lower light-shielding layer 109 covers the charge storage region 105. The lower light-shielding layer 109 has the opening 190 above the charge generation region 102. The dielectric film 110 is disposed to cover the entire charge generation region 102 and part of the lower light-shielding layer 109. As in the light-receiving region PXR, the gate electrode 101, the dielectric region 130, the gate electrode 104, the charge storage region 105, the gate electrode 107, the gate electrode 108, the lower light-shielding layer 109, the dielectric film 110, and the charge detection region 103 are disposed also in the light-shielded region OBR. However, the charge generation region 102 is covered with the upper light-shielding layer 231 in the light-shielded region OBR. Therefore, a signal from the charge generation region 102 can be processed as a reference signal for black-level correction.

The upper light-shielding layer 231 is disposed as a shield against light in each light-shielded unit OBA. The structure of the light-shielded unit OBA between the charge generation region 102 and the upper light-shielding layer 231 is substantially the same as the structure of the light-receiving unit PXL from the semiconductor layer 200 to the intermediate layer 229, or the difference in the structure is very small. With such a configuration, a signal obtained from each light-shielded unit OBA is expected to have a higher accuracy as the reference signal for black-level correction.

As illustrated in FIG. 3B, the light-shielded unit OBB can be provided in the light-shielded region OBR in addition to the light-shielded unit OBA. The light-shielded unit OBB includes the charge storage region 105 that stores charges transferred thereto from the charge generation region 102 of the light-shielded unit OBB. The light-shielded unit OBB includes the dielectric region 130 located above the charge generation region 102 of the light-shielded unit OBB and surrounded by the interlayer insulating layers 214X. In the light-shielded unit OBB, the lower light-shielding layer 109 covers the charge storage region 105 of the light-shielded unit OBB between the interlayer insulating layers 214X and the semiconductor layer 200. Further, in the light-shielded unit OBB, the lower light-shielding layer 109 covers the charge generation region 102 between the dielectric region 130 and the semiconductor layer 200. That is, in the light-shielded unit OBB, the lower light-shielding layer 109 covers not only the charge storage region 105 but also the charge generation region 102. The upper light-shielding layer 231 is disposed above the dielectric region 130 as in the light-shielded unit OBA, and the dielectric region 130 is covered with the upper light-shielding layer 231 and is shielded against light. The upper light-shielding layer 231 in the light-shielded unit OBB is constituted by a light-shielding film 230 that is continuous to the upper light-shielding layer 231 in the light-shielded unit OBA.

The light-shielded unit OBB differs from the light-shielded unit OBA in that the lower light-shielding layer 109 of the light-shielded unit OBB does not have an opening corresponding to the opening 190 of the light-shielded unit OBA above the charge generation region 102. In the light-shielded unit OBB, the lower light-shielding layer 109 can have openings equivalent to the openings 191 and 192 of the light-shielded unit OBA. In addition, since the area of the semiconductor layer 200 that is shielded against light by the lower light-shielding layer 109 located above the charge generation region 102 is larger in the light-shielded unit OBB than that in the light-shielded unit OBA, the light-shielding degree is high and consequently the optical accuracy of the black level is higher than that of the light-shielded unit OBA. However, in terms of reproducibility of the noise component of the light-receiving unit PXL, the light-shielded unit OBB is inferior to the light-shielded unit OBA having the opening 190 just like the light receiving unit PXL. Thus, black-level correction using the signal from the light-shielded unit OBA and black-level correction using the signal from the light-shielded unit OBB are desirably used for different circumstances or used in combination as needed. Although the light-shielded units OBA and the light-shielded units OBB can coexist in the light-shielded region OBR as in this embodiment, no light-shielded units OBB may be disposed in the light-shielded region OBR and the light-shielded units OBA alone may be disposed in the light-shielded region OBR. In addition, if the charge generation region 102 is sufficiently shielded against light by the lower light-shielding layer 109 alone in the light-shielded unit OBB, the upper light-shielding layer 231 may be omitted.

The structure of the pixel units UNT will be described in detail. Referring to FIGS. 3A and 3B, the charge generation region 102 in the semiconductor layer 200 is, for example, an n-type impurity region. In the plurality of pixel units UNT, the n-type impurity regions serving as the charge generation regions 102 are charge collecting regions and have substantially the same impurity concentration. Specifically, when Cnmax denotes the highest n-type impurity concentration of the charge generation regions 102 of the light-receiving units PXL, the highest n-type impurity concentration of the pixel units UNT other than the light-receiving units PXL is greater than or equal to Cnmax/2 (half) and less than or equal to 2×Cnmax (twofold). In addition to the n-type charge generation region 102, a photodiode of the charge generation unit 2 includes a charge generation region, which is a p-type impurity region that forms a p-n junction with the n-type charge generation region 102 at respective sides and under the n-type charge generation region 102. A range of the charge generation region 102 is a range in which charges to be collected by the n-type charge generation region 102 serving as the charge collecting region are generated. This range is determined by a potential distribution in the semiconductor layer 200. A region where charges not collected by the n-type charge generation region 102 serving as the charge collecting region are generated is not the charge generation region of the pixel circuit. In this embodiment, the charge generation region 102 has a buried photodiode structure as a result of disposing a p-type impurity region 205 on the charge generation region 102, that is, between the charge generation region 102 and the surface of the semiconductor layer 200.

This structure enables a reduction in noise produced at an interface between the semiconductor layer 200 and an insulating film disposed on the surface of the semiconductor layer 200. The charge storage region 105 is, for example, an n-type impurity region. The charge storage region 105 has a buried structure as a result of disposing a p-type impurity region 206 between the charge storage region 105 and the surface of the semiconductor layer 200. This structure enables a reduction in noise in the charge storage region 105.

A protecting film 211 is disposed above the charge generation region 102. As the protecting film 211, a layer having a refractive index lower than that of the semiconductor layer 200, for example, a film containing silicon nitride (Sin) having a refractive index of approximately 2.0 can be used. The protecting film 211 may be a multilayer film further including a layer having a refractive index lower than that of the silicon nitride layer, for example, a silicon oxide layer having a refractive index of approximately 1.5, in addition to the silicon nitride layer. The protecting film 211 is located between the dielectric film 110 and the semiconductor layer 200 and extends between the lower light-shielding layer 109 and the semiconductor layer 200. The protecting film 211 covers the charge storage region 105 and the gate electrodes 101, 104, and 106 between the lower light-shielding layer 109 and the semiconductor layer 200. The protecting film 211 also covers the charge output region 111, the charge detection region 103, and the impurity regions 112 and 113. The protecting film 211 can be used as an etching stop film when contact holes for contact plugs are formed.

Sidewalls 212 are disposed between the protecting film 211 and the lower light-shielding layer 109. The sidewalls 212 are composed of an insulator, such as silicon oxide or silicon nitride, and cover respective stepped portions of an uneven surface of the protecting film 211 formed because of the gate electrodes 101, 104, and 106. The sidewalls 212 reduce unevenness of the base of the lower light-shielding layer 109 and consequently reduce unevenness of the upper surface of the lower light-shielding layer 109. As a result, generation of stray light having strong directivity is suppressed at the upper surface of the lower light-shielding layer 109.

An insulator film 213, which is a single-layer film composed of silicon oxide, is disposed between the protecting film 211 and the dielectric film 110. The insulator film 213 extends between the interlayer insulating layer 2141 and the lower light-shielding layer 109 to cover the lower light-shielding layer 109 between the dielectric film 110 and the lower light-shielding layer 109. Note that FIGS. 3A and 3B integrally illustrate the insulator film 213 and the interlayer insulating layer 2141.

A contact plug 2191 that connects the wiring layer 2161 to the semiconductor layer 200 and the gate electrode and via plugs 2192 and 2193 that interconnect the wiring layers 216X are disposed above the semiconductor layer 200. The contact plug 2191 is composed mainly of tungsten, and the via plugs 2192 and 2193 are composed mainly of copper. The wiring layer 2162 and the via plug 2192, and the wiring layer 2163 and the via plug 2193 are integrally formed to have a dual damascene structure. The wiring layer 2163 can include, in addition to the conductive portion composed mainly of copper, a barrier metal portion composed of tantalum or titanium and/or tantalum nitride or titanium nitride.

Copper is suitably used as the main constituent of the wiring layers 216X. Alternatively, the main constituent of the wiring layers 216X may be aluminum, tungsten, polysilicon, or the like. In order to apply a voltage to the lower light-shielding layer 109, the wiring layer 2161 may be connected to the lower light-shielding layer 109 (the connection is not illustrated). Alternatively, a contact (not illustrated) may be formed between the lower light-shielding layer 109 and the semiconductor layer 200 for connection.

Diffusion preventing layers 2171, 2172, and 2173 (hereinafter, collectively referred to as diffusion preventing layers 217X) are disposed between the respective wiring layers 216X and the respective interlayer insulating layers 214X in order to prevent particularly a diffusion of Cu of the wiring layers 216X to the interlayer insulating layers 214X. The diffusion preventing layers 217X are disposed to be in contact with the respective wiring layers 216X. As the diffusion preventing layers 217X, an insulating layer of silicon nitride (SiN) or silicon carbide (SiC), for example, is used. Alternatively, as the material of the diffusion preventing layers 217X, silicon carbonitride (SiCN) can be used. If silicon carbonitride (SiCN) contains more carbon than nitrogen, the silicon carbonitride may be categorized into silicon carbide. If silicon carbonitride (SiCN) contains more nitrogen than carbon, the silicon carbonitride may be categorized into silicon nitride. The diffusion preventing layers 217X surround the dielectric region 130 just like the interlayer insulating layers 214X. The diffusion preventing layers 217X may have a refractive index that is different from or is equal to the refractive index of the dielectric region 130. In the case where the refractive index of the diffusion preventing layers 217X is higher than the refractive index of the interlayer insulating layers 214X, a leakage of light from the dielectric region 130 to the diffusion preventing layers 217X is successfully reduced by setting the thickness of the diffusion preventing layers 217X smaller than the thickness of the interlayer insulating layers 214X. Interfaces formed by the diffusion preventing layers 217X and the interlayer insulating layers 214X can reflect light traveling toward the charge generation region 102. If the dielectric region 130 is disposed in place of the diffusion preventing layers 217X above the charge generation region 102, the number of interfaces up to the charge generation region 102 can be reduced. Thus, such a configuration is effective for increasing the sensitivity. To obtain this effect, the refractive index and the dielectric constant of the dielectric region 130 need not be set lower than those of the interlayer insulating layers 214X as long as the dielectric region 130 is surrounded by a plurality of insulator layers (the diffusion preventing layers 217X and the interlayer insulating layers 214X).

Each light-receiving unit PXL includes not only the dielectric region 130 but also an inner-layer lens 240 as an optical system disposed right above the charge generation region 102. Each light-receiving unit PXL may further include a color filter 250 and a microlens 251 above the inner-layer lens 240. The inner-layer lens 240 is disposed for each light-receiving unit PXL in a silicon nitride layer 242 that continuously covers the light-receiving region PXR.

The silicon oxynitride layer 228 for antireflection, the intermediate layer 229, and a silicon oxynitride layer 243 for antireflection are disposed between the dielectric region 130 and the inner-layer lens 240. The silicon oxynitride layers 228 and 243 have a refractive index of approximately 1.6 to 1.7, for example. As the material of the intermediate layer 229, silicon oxide (SiO) having a refractive index of approximately 1.5 can be used. The intermediate layer 229 can be used as an interlayer insulating layer in the peripheral region PRR. A silicon oxynitride layer 241 may be further disposed above the inner-layer lens 240. The use of such an antireflection structure can increase the transmittance for the incident light and consequently increase the sensitivity.

A planarizing layer 244 composed of an organic material (resin) is disposed between the inner-layer lens 240 and the color filter 250. A planarizing layer 245 composed of an organic material (resin) is disposed between the color filter 250 and the microlens 251. Each of the color filter 250 and the microlens 251 is composed of an organic material. Note that the planarizing layer 245 and the microlens 251 can be formed integrally. In the case where the inner-layer lens 240 is not provided in the silicon nitride layer 242, the planarizing layer 244 can be omitted.

FIG. 3C illustrates a cross-sectional structure of the peripheral region PRR. FIG. 3C illustrates a p-type MOS transistor in the peripheral region PRR by way of example. This p-type MOS transistor can constitute, together with an n-type MOS transistor, a complementary MOS (CMOS) circuit. A p-type impurity region 208 serving as a source and a drain of the p-type MOS transistor is disposed in an impurity region 207 which is an n-type well. In addition, the MOS transistors are isolated from each other by an element isolation region 114 having a shallow trench isolation (STI) structure or a local oxidation of silicon (LOCOS) structure. By etching the film that serves as the protecting film 211 in the pixel units UNT, side spacers 116 are formed on respective sidewalls of a gate electrode 115 of the p-type MOS transistor. The impurity region 208 is formed to have a lightly doped drain (LLD) structure by using the side spacers 116. A silicide region 117 of a refractory metal silicide, for example, cobalt silicide or nickel silicide, is disposed on upper surfaces of the gate electrode 115 and the impurity region 208 serving as the source and the drain. The silicide region 117 reduces resistance between a contact plug 2190 and the impurity region 208. A protecting film 118 can serve as an etching stop film when a contact hole for the contact plug 2190 is formed and can serve as a diffusion preventing film that prevents a diffusion of a metal from the silicide region 117. The protecting film 118 is formed by etching a film that also serves as the dielectric film 110. The dielectric material film 133, which is formed after formation of the interlayer insulating layer 2144 and constitutes the light-guiding path in the light-receiving units PXL and the light-shielded units OBA and OBB, is omitted in the peripheral region PRR. The intermediate layer 229 is disposed on the interlayer insulating layer 2144. A via plug 2194 is provided to penetrate through the intermediate layer 229 and the interlayer insulating layer 2144. An electrode 2164 for input/output is provided for the via plug 2194. The electrode 2164 is formed by etching a conductor film that also serves as the upper light-shielding layer 231. As described above, the electrode 2164 and conductive members constituting wirings in the peripheral region PRR can be formed simultaneously in the process of forming the upper light-shielding layer 231. In the peripheral region PRR, the intermediate layer 229 functions, together with the interlayer insulating layer 2144, as an interlayer insulating layer between the wiring layer 2163 and a set of the electrode 2164 and a wiring layer at the same level as the layer of the electrode 2164. A passivation film which is a multilayer film constituted by the silicon oxynitride layer 241, the silicon nitride layer 242, and the silicon oxynitride layer 243 is formed to cover the electrode 2164 and wirings (not illustrated). The silicon nitride layer 242 of the passivation film is the layer that constitutes the inner-layer lens 240 in the pixel region. The passivation film has an opening 260 for external connection above the electrode 2164.

Second Embodiment

Figure 5:
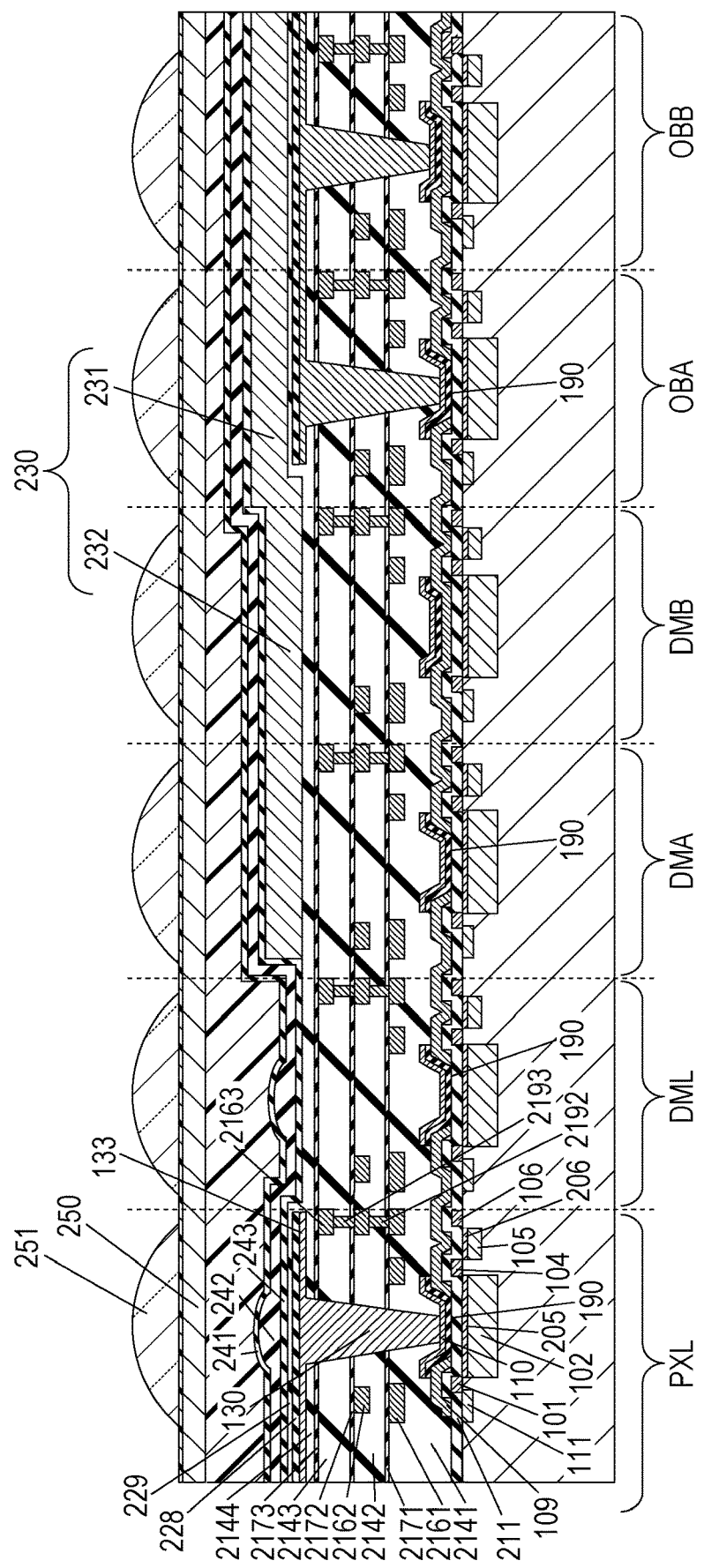
FIG. 5 is a schematic cross-sectional view of the photoelectric conversion apparatus.

A second embodiment will be described with reference to FIGS. 4 and 5. The second embodiment relates to the intermediate region DMR located between the light-receiving region PXR and the light-shielded region OBR as described in FIG. 1A.

FIG. 4 is a plan view of a portion near the semiconductor layer 200 of a dummy light-receiving unit DML and dummy light-shielded units DMA and DMB in the intermediate region DMR as well as the light-receiving unit PXL in the light-receiving region PXR and the light-shielded units OBA and OBB in the light-shielded region OBR. FIG. 5 is a cross-sectional view of the light-receiving unit PXL, the dummy light-receiving unit DML, the dummy light-shielded units DMA and DMB, and the light-shielded units OBA and OBB. Since the light-receiving unit PXL and the light-shielded units OBA and OBB can have the same or substantially the same configuration as that of the first embodiment, a detailed description thereof is omitted. Although the opening 191 in FIG. 2B is illustrated as an opening 193 in FIG. 4, the opening 193 may have the same or substantially the same function and shape as the opening 191.

The dummy light-receiving unit DML and the dummy light-shielded units DMA and DMB are disposed between the light-receiving unit PXL and the light-shielded units OBA and OBB. The dummy light-receiving unit DML and the dummy light-shielded units DMA and DMB are auxiliary pixel units UNT provided to enhance the properties of the light-receiving unit PXL and/or the light-shielded units OBA and OBB.

The dummy light-receiving unit DML and the dummy light-shielded units DMA and DMB can be configured so that no signals are obtained therefrom. For example, in the dummy light-receiving unit DML and the dummy light-shielded units DMA and DMB, neither the amplification transistor 8 nor the selection transistor 9 may be connected to the signal output line 10. Alternatively, even if the dummy light-receiving unit DML and the dummy light-shielded units DMA and DMB output signals to the signal output line 10, the signals may be excluded from the signals used in signal processing. Alternatively, even if the signals from the dummy light-receiving unit DML and the dummy light-shielded units DMA and DMB are used in signal processing, the result may be not reflected in the image. Note that if the signals from the dummy light-receiving unit DML and the dummy light-shielded units DMA and DMB are useful, information based on the signals may be used for the image.

In the dummy light-receiving unit DML and the dummy light-shielded units DMA and DMB, the charge storage region 105 is covered with the lower light-shielding layer 109 as in the light-receiving unit PXL and the light-shielded units OBA and OBB. In the dummy light-receiving unit DML and the dummy light-shielded unit DMA, the lower light-shielding layer 109 has the opening 190 above the charge generation region 102 as in the light-receiving unit PXL and the light-shielded unit OBA. In the dummy light-shielded unit DMB, the lower light-shielding layer 109 covers the charge generation region 102 as in the light-shielded unit OBB. The dummy light-receiving unit DML does not include the upper light-shielding layer. Thus, the charge generation region 102 of the dummy light-receiving unit DML is capable of receiving light through the opening 190.

Since the lower light-shielding layer 109 of the dummy light-receiving unit DML and the dummy light-shielded unit DMA has the opening 190, an amount of light that can reach the light-shielded unit OBA due to reflection of light at the lower light-shielding layer 109 is successfully reduced. A reason for this is that the opening 190 reduces the area of the lower light-shielding layer 109 and consequently reduces reflection of light by the lower light-shielding layer 109 above the charge generation region 102. The opening 190 also allows light that is incident to the dummy light-receiving unit DML and the dummy light-shielded unit DMA to be absorbed at the charge generation region 102 of the dummy light-receiving unit DML and the dummy light-shielded unit DMA.

The dummy light-shielded units DMA and DMB include an upper light-shielding layer 232 disposed to be farther from the semiconductor layer 200 than the lower light-shielding layer 109. That is, the distance between the upper light-shielding layer 232 and the semiconductor layer 200 in the dummy light-shielded units DMA and DMB is greater than the distance between the lower light-shielding layer 109 and the semiconductor layer 200 in the dummy light-shielded units DMA and DMB. The upper light-shielding layer 232 shields, against light, the charge generation region 102 of the dummy light-shielded unit DMA including the lower light-shielding layer 109 having the opening 190. In addition, the upper light-shielding layer 232 increases the light-shielded degree at the charge generation region 102 in the dummy light-shielded unit DMB including the charge generation region 102 covered with the lower light-shielding layer 109.

The upper light-shielding layer 232 of the dummy light-shielded units DMA and DMB is constituted by the light-shielding film 230 that is continuous to the upper light-shielding layer 231 of the light-shielded units OBA and OBB. By configuring the light-shielding film 230 continuous, that is, not to be sectioned, light that is incident to the charge generation region 102 of the light-shielded unit OBA from a slit formed as a result of sectioning can be suppressed. By disposing the dummy light-shielded units DMA and DMB between the light-receiving unit PXL and the light-shielded unit OBA, the light-shielded unit OBA is successfully placed farther from the light-receiving unit PXL by the dimensions of the dummy light-shielded units DMA and DMB. Thus, a situation where light that is incident to a portion between the light shielding film 230 and the semiconductor layer 200 enters the charge generation region 102 of the light-shielded unit OBA is successfully avoided.

The upper light-shielding layer 232 is disposed to be closer to the semiconductor layer 200 than the upper light-shielding layer 231. That is, the distance between the upper light-shielding layer 232 and the semiconductor layer 200 in the dummy light-shielded units DMA and DMB is less than the distance between the upper light-shielding layer 231 and the semiconductor layer 200 in the light-shielded units OBA and OBB. Such a configuration makes an entrance for light to a portion between the light-shielding film 230 and the semiconductor layer 200 from the light-receiving region PXR narrower, and thus an amount of light that enters the light-shielded region OBR is successfully reduced. As a result, the black-level correction accuracy is successfully increased.

The dielectric region 130 that is surrounded by insulator layers such as the interlayer insulating layers 214X and the diffusion preventing layers 217X and is provided in the light-receiving units PXL is not disposed above the charge generation region 102 of the dummy light-receiving unit DML. Thus, the interlayer insulating layers 214X and the diffusion preventing layers 217X cover the charge generation region 102 of the dummy light-receiving unit DML. Specifically, the interlayer insulating layers 214X and the diffusion preventing layers 217X cover the entire opening 190 of the lower light-shielding layer 109 in the dummy light-receiving unit DML. Likewise, the dielectric region 130 that is surrounded by insulator layers such as the interlayer layers 214X and the diffusion preventing layers 217X and is provided in the light-shielded units OBA and OBB is not disposed above the charge generation region 102 of the dummy light-shielded units DMA and DMB. Thus, the interlayer insulating layers 214X and the diffusion preventing layers 217X cover the charge generation region 102 of the dummy light-shielded units DMA and DMB between the upper light-shielding layer 232 and the semiconductor layer 200. In addition, the interlayer insulating layers 214X and the diffusion preventing layers 217X cover the entire opening 190 of the lower light-shielding layer 109 in the dummy light-shielded unit DMA.

By omitting the dielectric region 130 in the dummy light-receiving unit DML and the dummy light-shielded units DMA and DMB as described above, a possibility of light propagating to the light-shielded units OBA and OBB through the dielectric regions 130 of the pixel units UNT other than the light-receiving units PXL is successfully reduced. This configuration is also considered such that the distance between the adjacent dielectric regions 130 of the light-receiving unit PXL and the light-shielded unit OBA or OBB is increased by the dimensions of the pixel units UNT not including the dielectric region 130. It is also considered such that propagation of light from the light-receiving unit PXL to the light-shielded unit OBA is suppressed by placing the light-receiving unit PXL farther from the light-shielded unit OBA or OBB.

In the second embodiment, not only the dielectric region 130 but also the dielectric material film 133 are omitted in the dummy light-receiving unit DML and the dummy light-shielded units DMA and DMB. With such a configuration, the possibility of light propagating to the light-shielded units OBA and OBB through the dielectric material film 133 is successfully reduced. In addition, as a result of the omission of the dielectric material film 133 in the dummy light-shielded units DMA and DMB, the upper light-shielding layer 232 can be disposed to be closer to the semiconductor layer 200 than the upper light-shielding layer 232 by at least the thickness of the dielectric material film 133. Thus, an amount of light that enters the light-shielded region OBR is successfully reduced as described above.

In the case where the dielectric region 130 is not provided in the dummy light-receiving unit DML and the dummy light-shielded units DMA and DMB, the dielectric film 110 which serves as the etching stop film may be omitted. In the dummy light-shielded unit DMB in which the lower light-shielding layer 109 covers the charge generation region 102, the dielectric film 110 may be omitted. However, as described above, in consideration of light absorption at the charge generation region 102 of the dummy light-receiving unit DML and the dummy light-shielded unit DMA, the dielectric film 110 is desirably provided in the dummy light-receiving unit DML and the dummy light-shielded unit DMA. In this embodiment, the dielectric film 110 that functions as an antireflection film is disposed above the charge generation region 102 of the dummy light-receiving unit DML and the dummy light-shielded unit DMA through the opening 190. With such a configuration, light absorption at the charge generation region 102 and light reflection at the surface of the semiconductor layer 200 are successfully suppressed.

In the second embodiment, the light-shielded unit OBA is disposed between the light-shielded unit OBB and the light-receiving unit PXL. Conversely, the light-shielded unit OBB may be disposed between the light-shielded unit OBA and the light-receiving unit PXL. Light is more likely to reach a portion between the light-shielding film 230 and the semiconductor layer 200 from the light-receiving region PXR, as the portion is closer to the end portion of the light-shielding film 230 near the light-receiving region PXR. However, the light-shielded unit OBB in which the charge generation region 102 is shielded against light twice by the upper light-shielding layer 231 and the lower light-shielding layer 109 is sufficiently shielded against light even if the light-shielded unit OBB is located close to the light-receiving region PXR. In addition, by placing the light-shielded unit OBA in which the lower light-shielding layer 109 has the opening 190 above the charge generation region 102 farther from the light-receiving region PXR, the light-shielded unit is sufficiently shielded against light by the upper light-shielding layer 231 even if there is the opening 190.

Third Embodiment

A fabrication method of the photoelectric conversion apparatus IS will be described as a third embodiment. FIGS. 6A to 9C are cross-sectional views illustrating the fabrication method of the photoelectric conversion apparatus IS.

In step a illustrated in FIG. 6A, the semiconductor layer 200 is prepared as a silicon wafer, and then the charge output region 111, the charge generation region 102, the charge storage region 105, and the gate electrodes 101, 104, and 106 of the respective transistors are formed.

Then, the protecting film 211 is formed on the charge generation region 102, the gate electrodes 101, 104, and 106 of the respective transistors, and sources and drains of the respective transistors. The protecting film 211 composed of silicon nitride can be used. In addition, the protecting film 211 can be used as a film used for forming the side spacers 116 (see FIG. 3C) of transistors disposed in the peripheral region PRR located outside the pixel region (not illustrated).

Figure 6B:
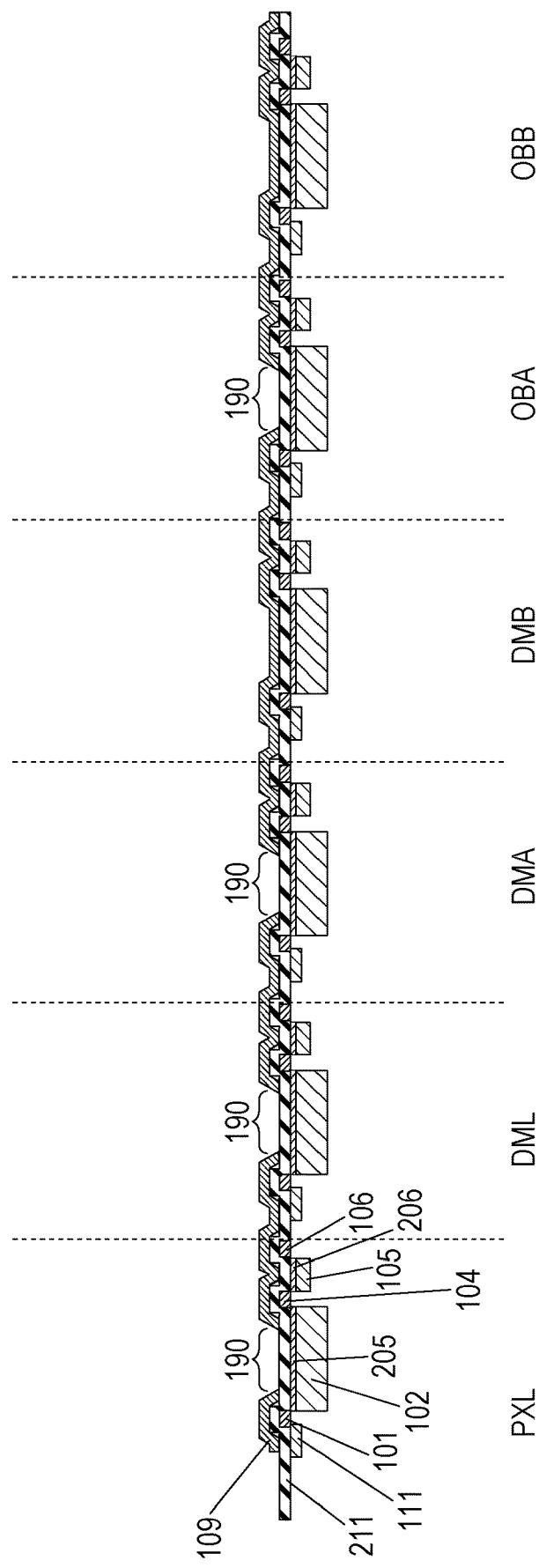

Then in step b illustrated in FIG. 6B, an insulator film such as a silicon oxide film is formed on the protecting film 211, and the sidewalls 212 (see FIGS. 3A and 3B) are formed by etching back this insulator film. A light-shielding material film, such as a tungsten film, which serves as the lower light-shielding layer 109 is formed on the protecting film 211 with the sidewalls 212 interposed between the light-shielding material film and the protecting film 211 so that the light-shielding material film covers at least the charge generation region 102, the gate electrode 104, and the charge storage region 105. Then, a portion of the light-shielding material film that overlaps the charge generation region 102 in plan view is removed to create the lower light-shielding layer 109 that covers part of the charge generation region 102 and the charge storage region 105 and that has the opening 190 above the charge generation region 102. Dry etching can be used to remove the light-shielding material film.

Then in step c illustrated in FIG. 6C, an insulator film such as a silicon oxide film is formed on the lower light-shielding layer 109, and further the dielectric film 110 such as a silicon nitride film is formed to cover the opening 190 of the lower light-shielding layer 109 located above the charge generation region 102 with this insulator film interposed therebetween. Dry etching can be used for patterning of the dielectric film 110.

Figure 7A:
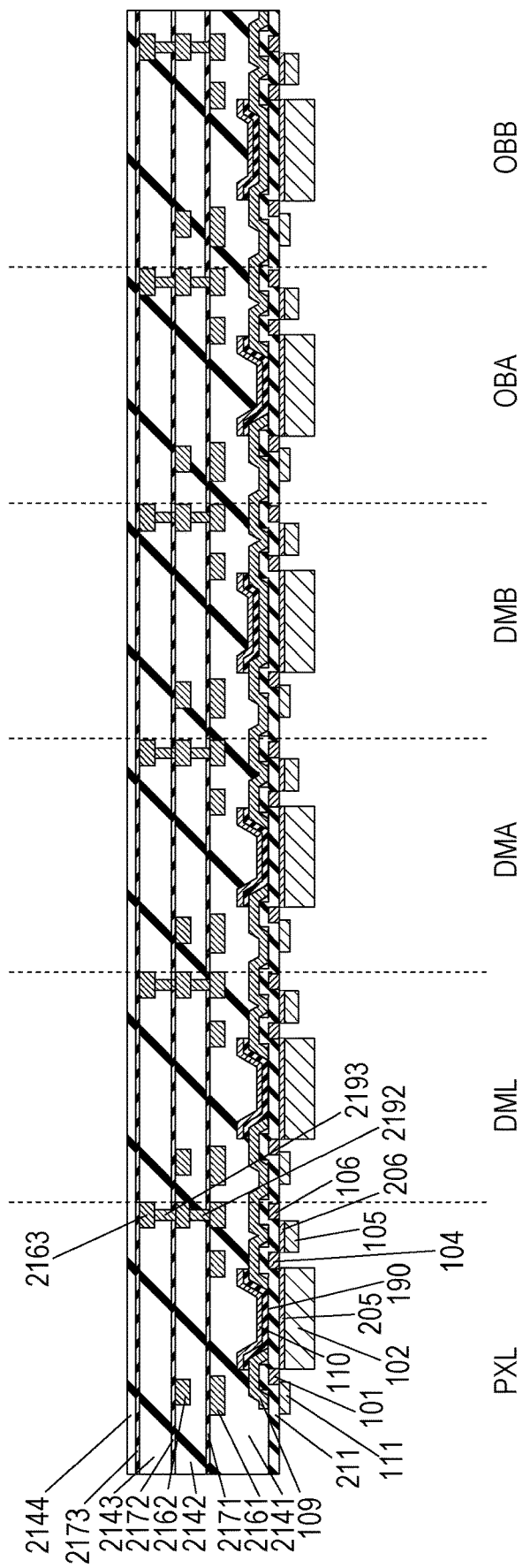
FIGS. 7A to 7C are schematic cross-sectional views illustrating the fabrication method of the photoelectric conversion apparatus.

Then in step d illustrated in FIG. 7A, the contact plugs 2190 and 2191 (see FIGS. 3A to 3C), the interlayer insulating layers 214X, the diffusion preventing layers 217X, the wiring layers 216X, and the via plugs 2192 and 2193 are formed by using currently available methods. The wiring layers 216X and the via plugs 2192 and 2193 composed mainly of copper can be formed by using the dual damascene method.

Figure 7B:
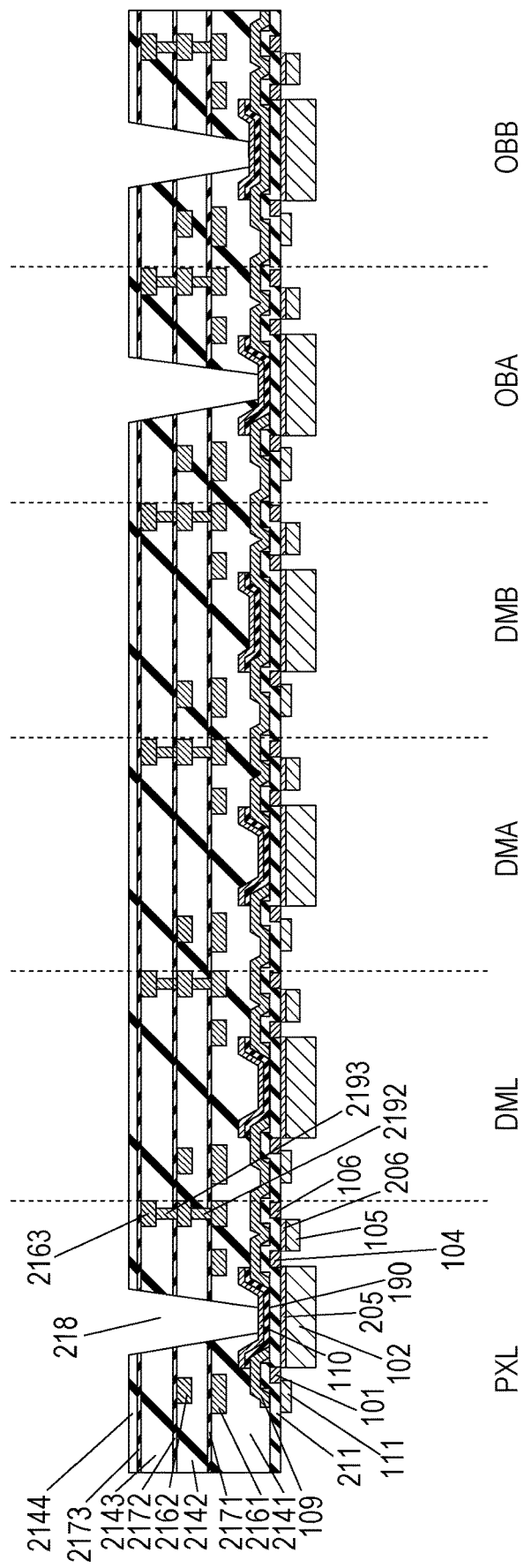

Then in step e illustrated in FIG. 7B, the holes 218 are formed at portions of the interlayer insulating layers 214X and the diffusion preventing layers 217X where light-guiding paths are formed, that is, portions above the charge generation regions 102. The holes 218 are formed the light-receiving unit PXL and the light-shielded units OBA and OBB and are not formed in the dummy light-receiving unit DML and the dummy light-shielded units DMA and DMB. Dry etching can be used as the method for forming the holes 218. When the holes 218 are formed, the dielectric film 110 functions as the etching stop film. As a result of the dielectric film 110 stopping the etching, an increase in noise due to etching damage of the charge generation region 102 can be avoided. The dielectric film 110 serving as the etching stop film may be over-etched. The dielectric film 110 is merely required to be a material that is less easily etched than the interlayer insulating layer 2141 under etching conditions used when the interlayer insulating layer 2141 is etched. If the interlayer insulating layer 2141 is composed of a material containing mainly silicon oxide (may be a glass material, such as BPSG, PSG, or NSG), a silicon nitride film or a silicon carbide film can be used for the dielectric film 110. In addition, the dielectric film 110 may be partially or entirely removed by etching.

Figure 7C:
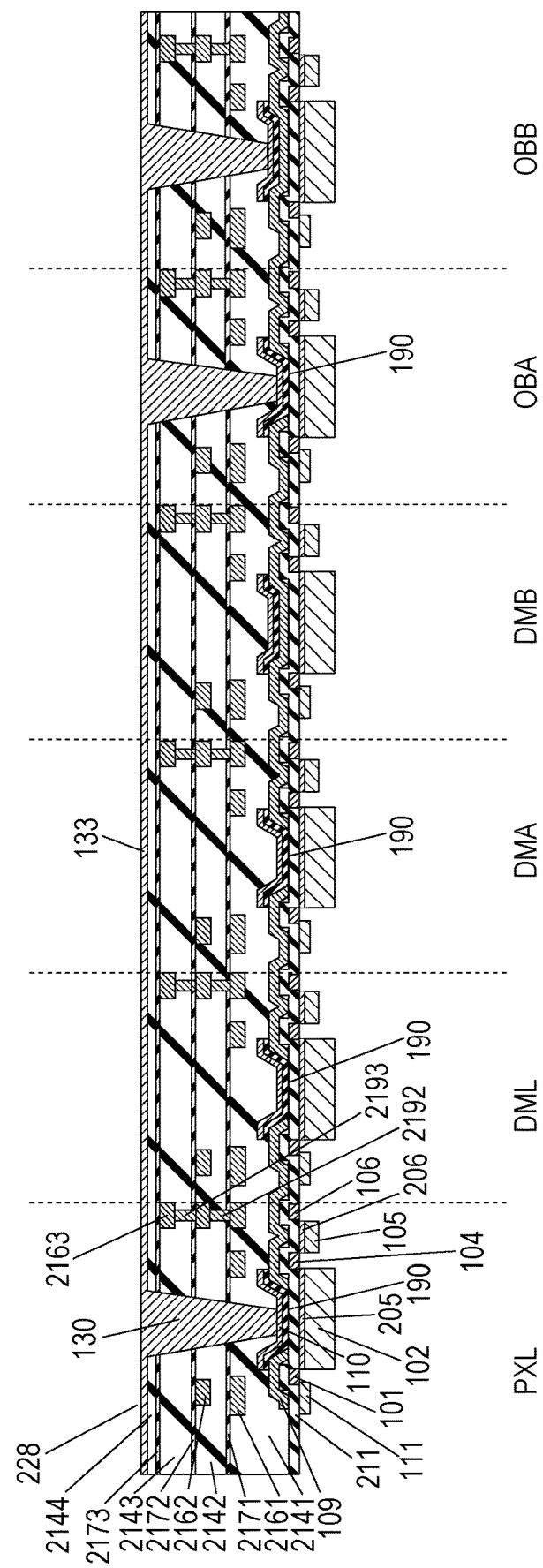

Then in step f illustrated in FIG. 7C, each hole 218 is filled with a high refractive index material having a refractive index higher than that of the interlayer insulating layers 214X as the dielectric material, and the dielectric region 130 serving as a light-guiding path is formed by performing planarization. High-density plasma chemical vapor deposition (CVD) or organic-material spin coating can be used as a method of filling the hole 218 with the high refractive index material. Planarization can be performed using chemical mechanical polishing (CMP) or the etch-back method. Part of the filling dielectric material that is present outside the hole 218 after planarization is the dielectric material film 133 which is the remaining dielectric material film. The dielectric material film 133 can be removed by planarizing the dielectric material until the interlayer insulating layer 2144 is exposed.

Figure 8A:
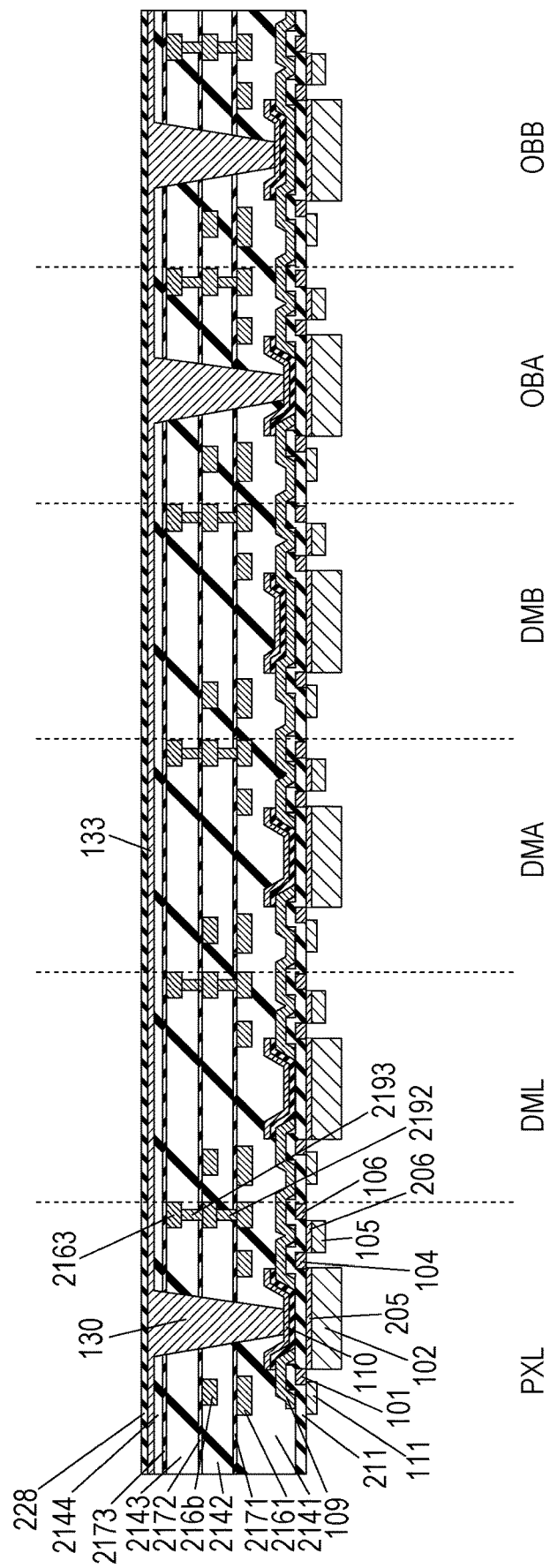
FIGS. 8A to 8C are schematic cross-sectional views illustrating the fabrication method of the photoelectric conversion apparatus.
Figure 8B:
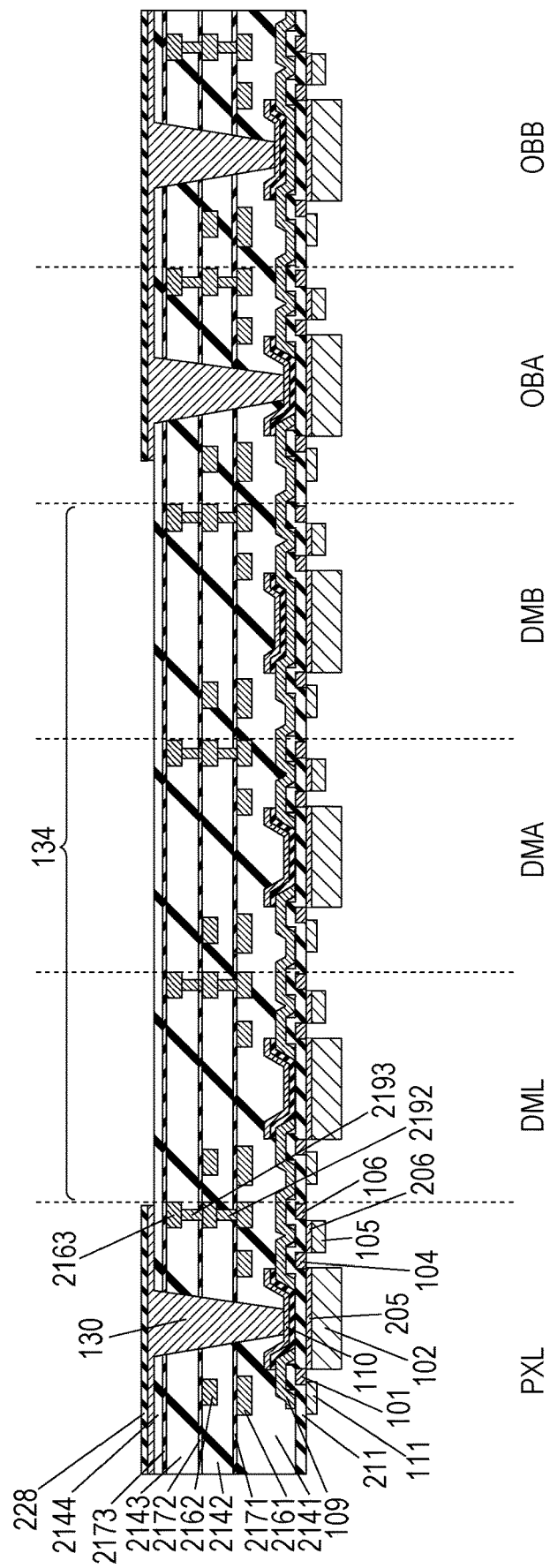

Then in step g illustrated in FIG. 8A, the silicon oxynitride layer 228 is formed on the dielectric material film 133. Note that a wiring layer 216b illustrated in FIG. 8A is equivalent to the wiring layer 2162 in the other drawings. In FIG. 7C, a portion where the silicon oxynitride layer 228 is to be formed is denoted using a reference sign 228; however, the silicon oxynitride layer 228 is not formed yet in step f illustrated in FIG. 7C and is formed in step g. Then in step h illustrated in FIG. 8B, the silicon oxynitride layer 228 and the dielectric material film 133 are removed by etching in the dummy light-receiving unit DML and the dummy light-shielded units DMA and DMB. Consequently, a slit 134 is formed in the dielectric material film 133 between the light-receiving region PXR and the light-shielded region OBR.

Figure 8C:
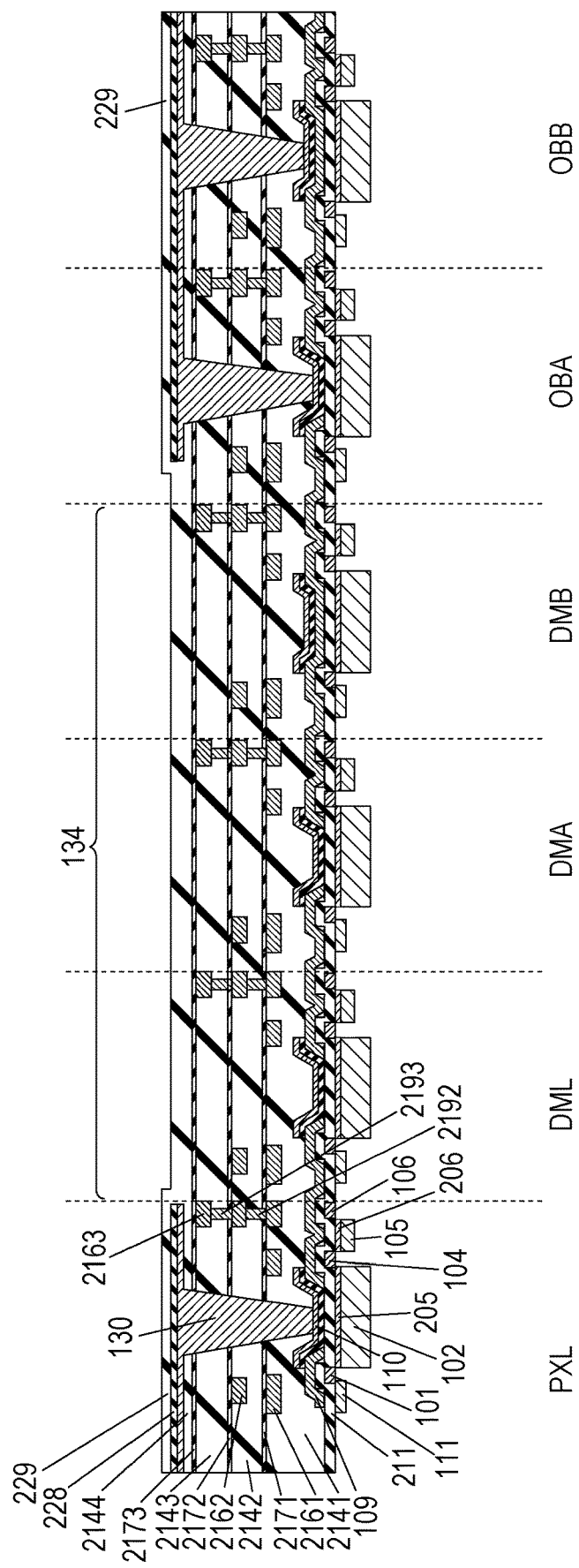

Then in step i illustrated in FIG. 8C, the intermediate layer 229 such as a silicon oxide film is formed. Since the silicon oxynitride layer 228 suppresses reflection of incident light compared with a configuration where the intermediate layer 229 is disposed in contact with the dielectric material film 133 (or the dielectric region 130), an amount of incident light to the charge generation region 102 is successfully increased in the light-receiving unit PXL.

Figure 9A:
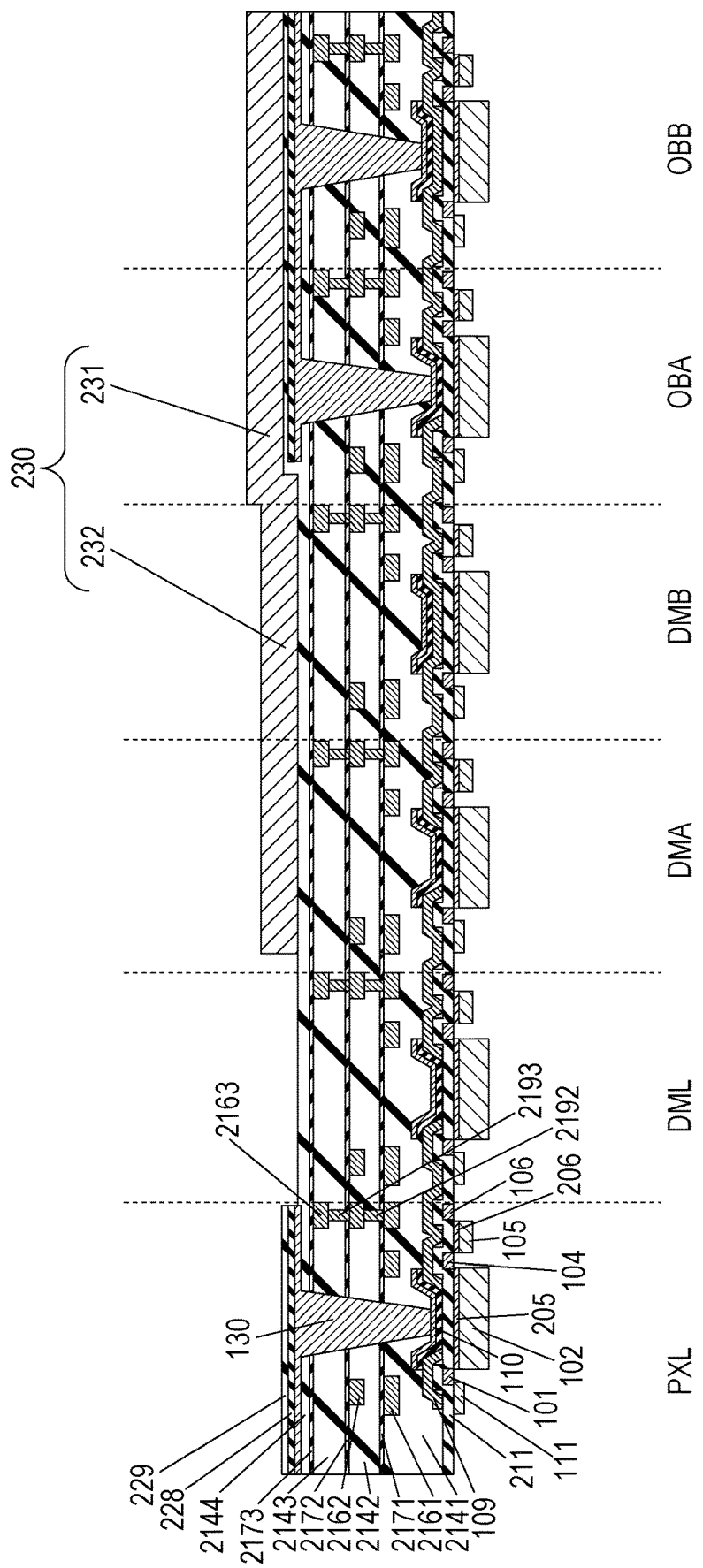
FIGS. 9A to 9C are schematic cross-sectional views illustrating the fabrication method of the photoelectric conversion apparatus.

Then in step j illustrated in FIG. 9A, the light-shielding film 230 that serves as the upper light-shielding layer 231 in the light-shielded units OBA and OBB and the upper light-shielding layer 232 in the dummy light-shielded units DMA and DMB is formed. The light-shielding film 230 is merely required to be capable of reflecting or absorbing light traveling toward the charge generation region 102. Thus, a metal that reflects light or an organic material that absorbs light is suitable as a material of the light-shielding film 230. In the third embodiment, an aluminum film is used. As a result of formation of the slit 134 in the dielectric material film 133 in step h, the intermediate layer 229 has a step that is lower in the dummy light-shielded units DMA and DMB than in the light-shielded units OBA and OBB. Thus, the upper light-shielding layer 232 is disposed to be closer to the semiconductor layer 200 than the upper light-shielding layer 231.

The light-shielding film 230 located above the light-receiving unit PXL and the dummy light-receiving unit DML is removed by patterning the light-shielding film 230. During patterning of the light-shielding film 230, the electrode 2164 (see FIG. 3C) and conductive members that constitute wirings in the peripheral region PRR can be formed.

Figure 9B:
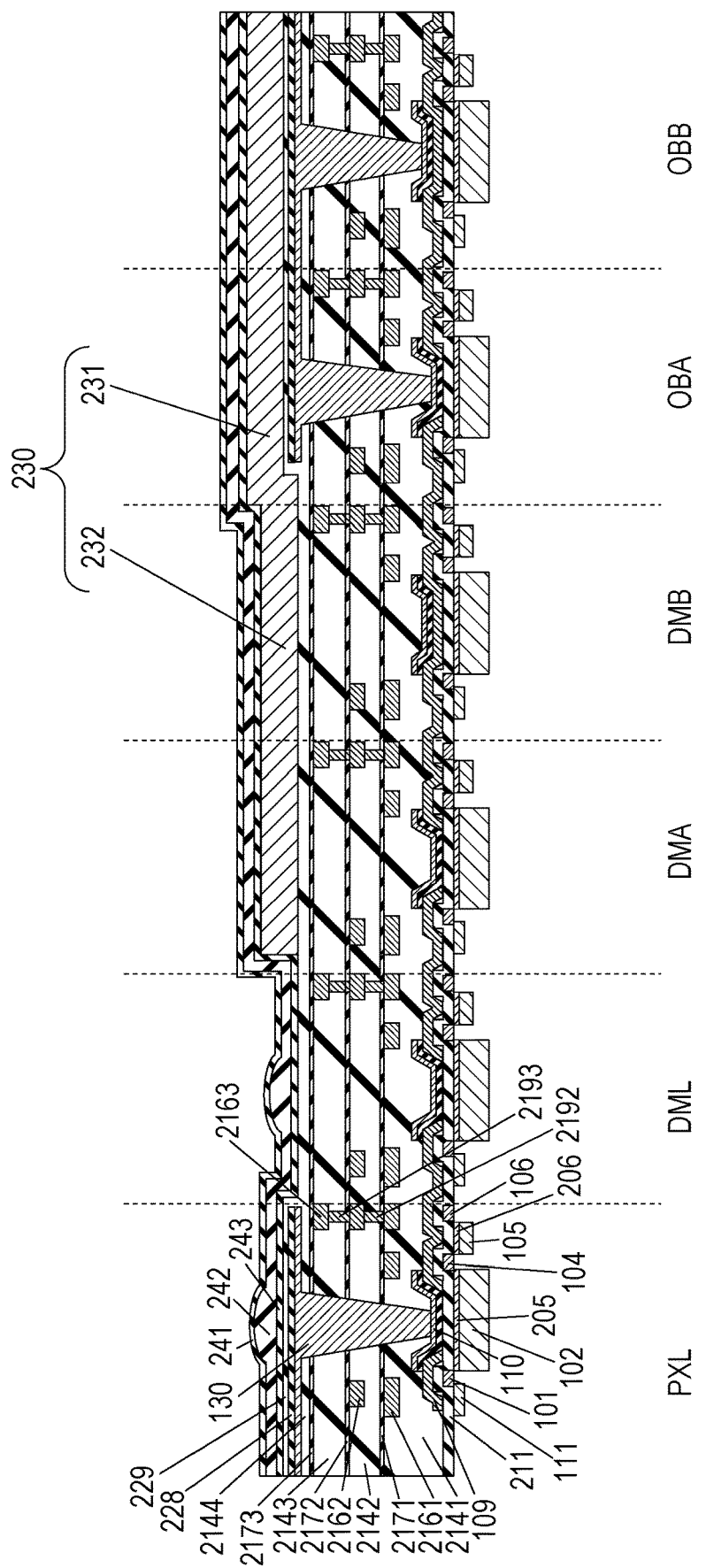

Then in step k illustrated in FIG. 9B, a silicon nitride film is formed on the silicon oxynitride layer 243. The silicon nitride film is processed by using the etch-back method to include the inner-layer lens 240, and consequently the silicon nitride layer 242 including the inner-layer lens 240 is formed. The silicon oxynitride layer 241 is formed on the silicon nitride layer 242. The silicon oxynitride layer 243, the silicon nitride layer 242, and the silicon oxynitride layer 241 function as a passivation film.

Figure 9C:
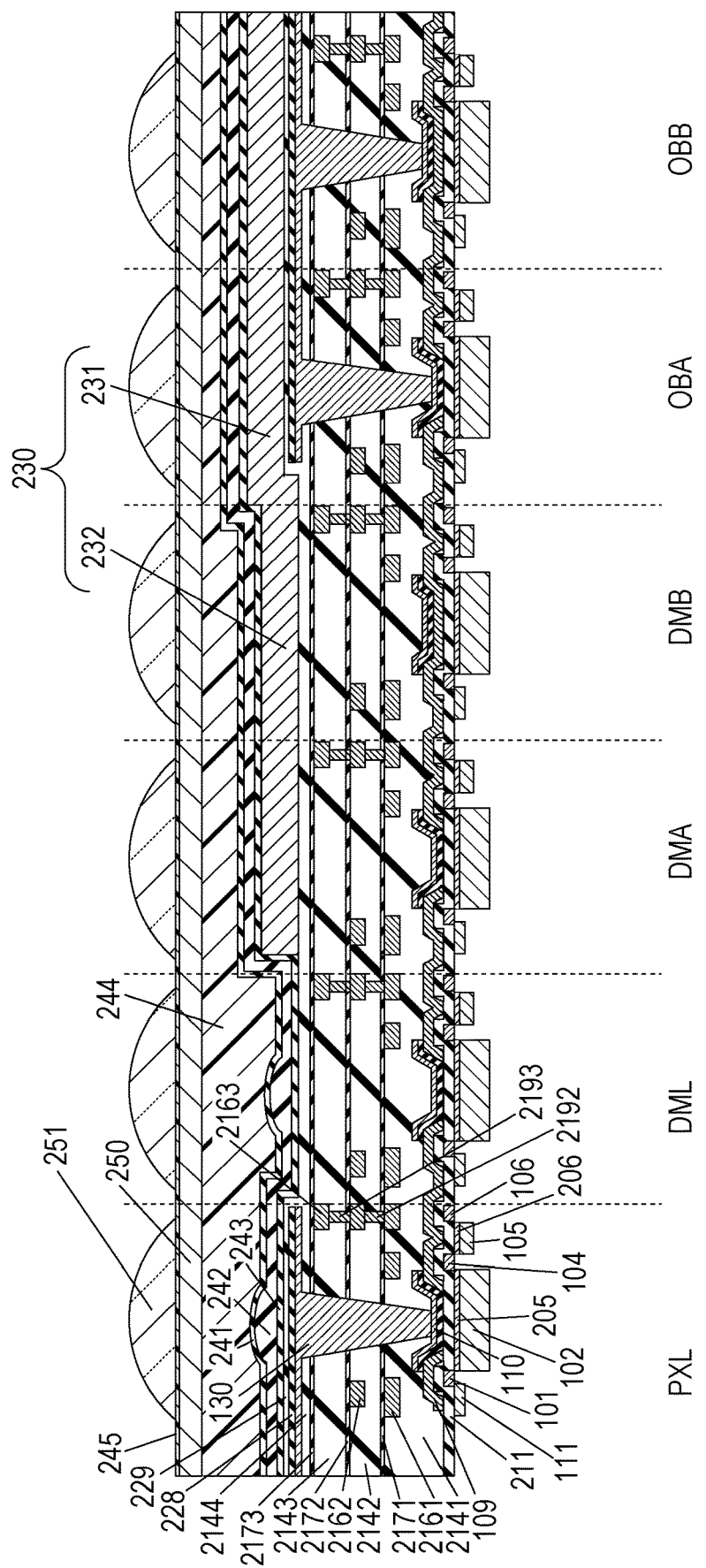

Then in step l illustrated in FIG. 9C, the planarizing layer 244, the color filter 250, the planarizing layer 245, and the microlens 251 are formed on the passivation film. The color filter 250 and the microlens 251 can be formed by photolithography of a photosensitive resin.

Fourth Embodiment

Figure 10A:
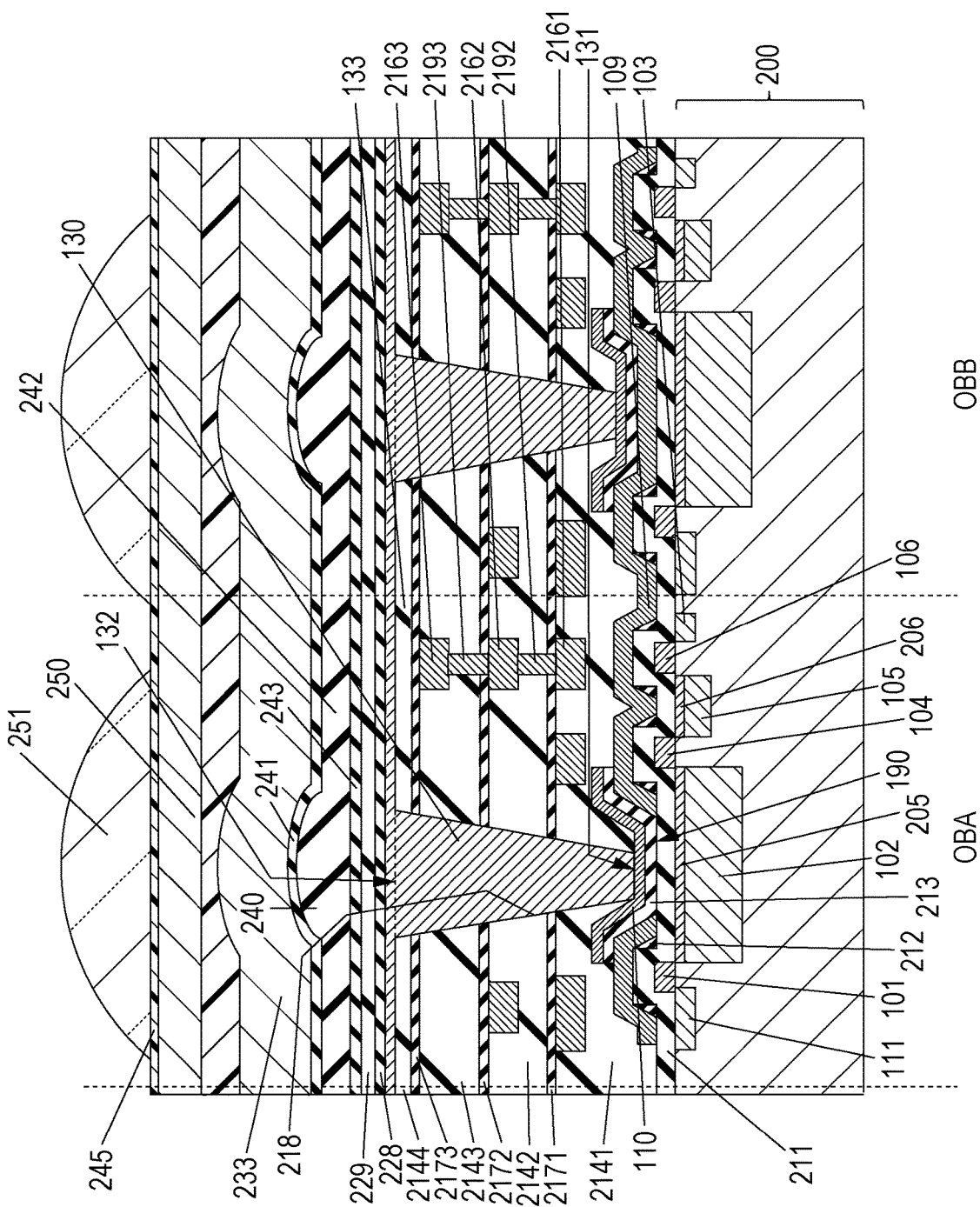
FIGS. 10A and 10B are schematic cross-sectional views of a photoelectric conversion apparatus.

A fourth embodiment of the photoelectric conversion apparatus IS will be described with reference to FIG. 10A. Note that components that are the same or substantially the same as those of the first embodiment are denoted by the same reference signs to omit or simply the description thereof. The configuration of the light-receiving unit PXL is substantially the same as that of the first embodiment.

In the fourth embodiment, the inner-layer lens 240 is formed above the dielectric region 130 also in the light-shielded region OBR as in the light-receiving region PXR. In the fourth embodiment, the silicon oxynitride layer 228 for antireflection, the intermediate layer 229, the silicon nitride layer 242 including the inner-layer lens 240, and the silicon oxynitride layer 241 for antireflection are also formed in the light-shielded region OBR as in the light-receiving region PXR.

The fourth embodiment differs from the first embodiment in that an upper light-shielding layer 233, in place of the upper light-shielding layer 231, is disposed above the inner-layer lens 240 with the silicon oxynitride layer 241 interposed between the inner-layer lens 240 and the upper light-shielding layer 233 in the light-shielded region OBR. The rest of configuration may be the same as that of the first embodiment. In particular, the lower light-shielding layer 109 covering the charge storage region 105 in the light-shielded unit OBA has the opening 190 above the charge generation region 102, and the lower light-shielding layer 109 covering the charge storage region 105 in the light-shielded unit OBB covers the charge generation region 102. The dielectric region 130 can be disposed above the charge generation region 102 in the light-shielded unit OBA and above the charge generation region 102 in the light-shielded unit OBB.

According to a fabrication method (not illustrated) according to the fourth embodiment, the silicon oxynitride layer 228 is formed after planarization of the light-guiding path is performed, and then the intermediate layer 229 is formed on the silicon oxynitride layer 228. The silicon nitride layer 242 including the inner-layer lens 240 is formed on the silicon oxynitride layer 243, and the silicon oxynitride layer 241 is formed on the silicon nitride layer 242. Then, a light-shielding film serving as the upper light-shielding layer 233 is formed in the light-shielded region OBR. Further, a passivation film (a silicon nitride layer and a silicon oxynitride layer) (not illustrated) may be disposed above the upper light-shielding layer 233. The color filter 250 and the microlens 251 may be provided. A hydrogen termination effect of the semiconductor layer 200 owing to hydrogen sintering from the silicon nitride layer 242 (particularly, the thick inner-layer lens 240) can be expected in the light-shielded region OBR as in the light-receiving region PXR, and a further increase in black-level correction accuracy can be expected in the fourth embodiment. A reason for this is that hydrogen supply from the silicon nitride layer 242 to the semiconductor layer 200, which is inhibited by the upper light-shielding layer 231 in the first embodiment, can be increased by disposing the upper light-shielding layer 233 above the silicon nitride layer 242 instead of below the silicon nitride layer 242.

Fifth Embodiment

Figure 10B:
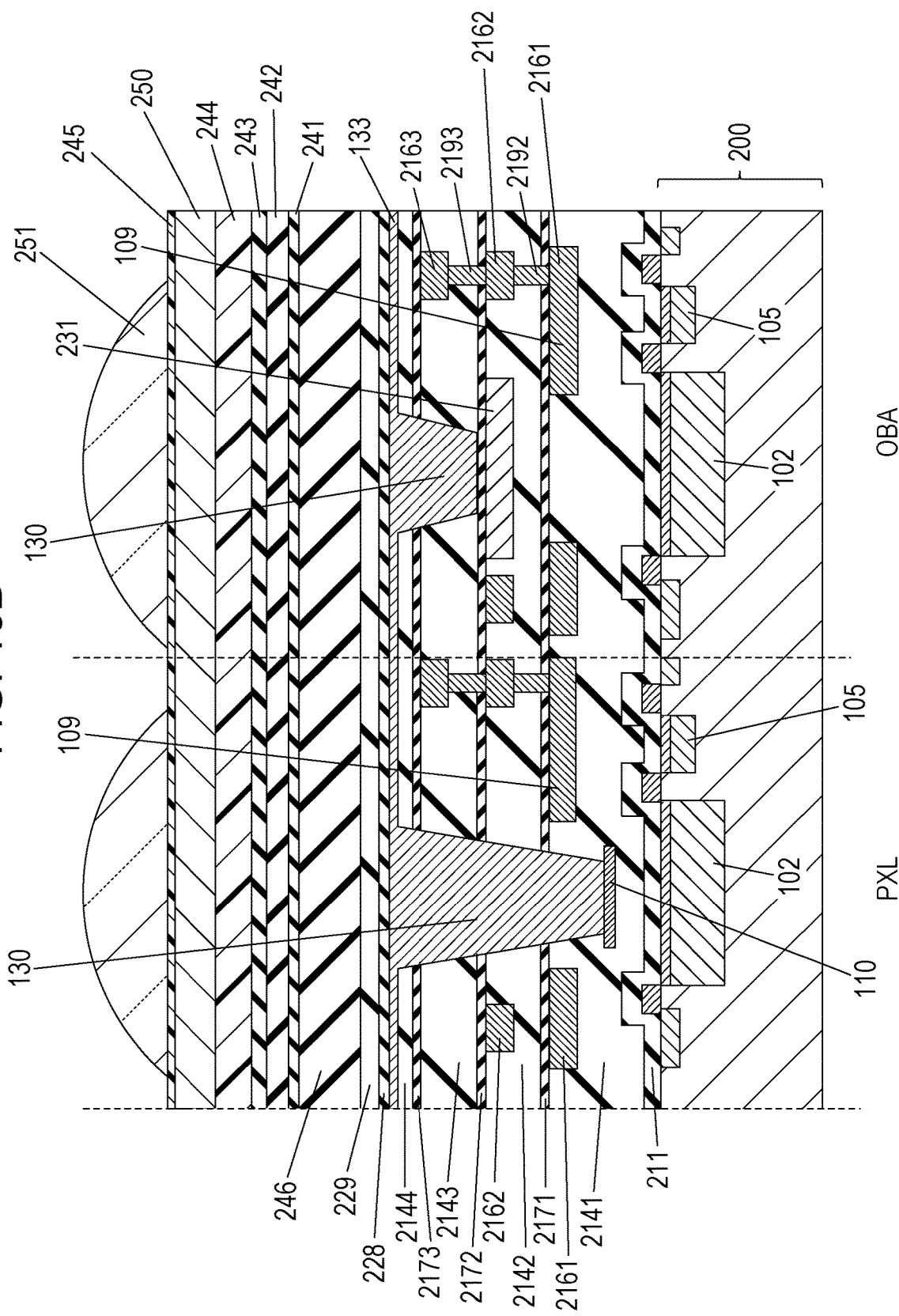

A fifth embodiment of the photoelectric conversion apparatus IS will be described with reference to FIG. 10B. Note that components that are the same or substantially the same as those of the first embodiment are denoted by the same reference signs to omit or simply the description thereof. The configuration of the light-receiving unit PXL may be substantially the same as that of the first embodiment. The configuration of the light-receiving unit PXL of the fifth embodiment differs from the first embodiment in that, the lower light-shielding layer 109 which covers the charge storage region 105 is constituted by the same layer as the wiring layer 2161. And a distance between the charge storage region 105 and the lower light-shielding layer 109 is more than a distance between the dielectric region 130 and the charge generation region 102. The configuration of the light-receiving unit PXL of the fifth embodiment differs from the first embodiment in that, a planarizing layer 246 is disposed between the intermediate layer and the multilayer film constituted by the silicon oxynitride layers 241 and 243 and the silicon nitride layer 242. The planarizing layer 246 is, for example, a silicon oxide layer, and extends to a position between the electrode 2164 and the multilayer film constituted by the silicon oxynitride layers 241 and 243 and the silicon nitride layer 242 in the peripheral region PRR illustrated in FIG. 30.

In the fifth embodiment, in the light-shielded unit OBA, the lower light-shielding layer 109 is constituted by the same layer as the wiring layer 2161, and the upper light-shielding layer 231 is constituted by the same layer as the wiring layer 2162. The upper light-shielding layer 231 is disposed below the dielectric region 130. That is, the upper light-shielding layer 231 is disposed between the dielectric region 130 and the charge generation region 102. The dielectric region 130 is surrounded by the interlayer insulating layers 2143 and 2144 but the interlayer insulating layers 2141 and 2142 do not have a hole for the dielectric region 130 and does not surround the dielectric region 130. Since the configuration from the charge generation region 102 to the dielectric region 130 differs between the light-receiving unit PXL and the light-shielded unit OBA in the fifth embodiment, the accuracy of the black-level reference signal based on an amount of dark current can decrease. The main reason for this is particularly that the influences of the presence of the dielectric region 130 (hydrogen termination effect) and the damage of the semiconductor layer 200 at the time of formation of an opening in the interlayer insulating layers differ. However, since the upper light-shielding layer 231 can be disposed to be closer to the opening 190 of the lower light-shielding layer 109, an amount of light entering the charge generation region 102 of the light-shielded unit OBA through the interlayer insulating layers is successfully reduced. Thus, a sufficient level of the accuracy of the black-level reference signal can be ensured also in this embodiment.

In addition, in this embodiment, the distance between the charge storage region 105 and the lower light-shielding layer 109 is less than the distance between the dielectric region 130 and the charge generation region 102. Thus, an amount of light that exits from the dielectric region 130 and enters the charge storage region 105 from a portion between the lower light-shielding layer 109 and the semiconductor layer 200 may increase. In terms of this point, the first embodiment is better than the fifth embodiment.

Sixth Embodiment

In the light-shielded unit OBA, a vertical positional relationship between a light-shielding layer that shields the charge storage region 105 against light (corresponding to the lower light-shielding layer 109 in the embodiments described above) and a light-shielding layer that shields the charge generation region 102 against light (corresponding to the upper light-shielding layer 231 in the embodiments described above) may be set opposite. In this case, in the light-receiving unit PXL and the light-shielded unit OBA, the light-shielding layer that shields the charge storage region 105 against light has the opening 190 above the charge generation region 102 and the dielectric region 130 is provided as in the embodiments described above. By providing the opening 190 in the light-shielding layer that shields the charge storage region 105 against light also in the light-shielded unit OBA, the black-level correction accuracy increases. A reason for this is that a difference in the optical, electrical, or chemical influences of the dielectric region 130 on the semiconductor layer 200 through the opening 190 can be eliminated or reduced between the light-receiving unit PXL and the light-shielded unit OBA. In the light-shielded unit OBA, the light-shielding layer that shields the charge generation region 102 against light is located between the opening 190 and the charge generation region 102, which is different from the embodiments described above. The light-shielding layer that shields the charge generation region 102 against light is located between the dielectric region 130 and the charge generation region 102 as in the fifth embodiment. The light-shielding layer than shields the charge storage region 105 against light may be disposed to be closer to the semiconductor layer 200 than the dielectric region 130 as in the light-receiving unit PXL according to the first embodiment. Alternatively, the dielectric region 130 may be disposed to be closer to the semiconductor layer 200 than the light-shielding layer that shields the charge storage region 105 against light as in the light-receiving unit PXL according to the fifth embodiment. The sixth embodiment is advantageous over the fifth embodiment since a difference in the distance between the semiconductor layer 200 and the dielectric region 130 is successfully eliminated or reduced between and the light-receiving unit PXL and the light-shielded unit OBA.

Seventh Embodiment

A seventh embodiment will be described with reference to FIGS. 11 and 12. The seventh embodiment relates to the intermediate region DMR located between the light-receiving region PXR and the light-shielded region OBR as described with reference to FIG. 1A. A photoelectric conversion apparatus IS according to the seventh embodiment includes a plurality of units each including the charge generation region 120 disposed in the semiconductor layer 200. The plurality of units include the light-receiving units PXL and light-shielded units OBC. Each of the light-receiving units PXL and the light-shielded units OBC includes the charge detection region 103 that detects charges transferred thereto from the charge generation region 102. Each of the light-receiving units PXL and the light-shielded units OBC includes a dielectric region 130 located above the charge generation region 120 and surrounded by the interlayer insulating layers 214X. The semiconductor layer 200 includes the intermediate region DMR located between the light-receiving units PXL and the light-shielded unit OBC. The intermediate region DMR is covered with the lower light-shielding layer 109 located between the interlayer insulating layer 214X and the semiconductor layer 200 over an area that is greater than an area of the charge generation region 102. The charge generation region 102 of the light-shielded units OBC and the intermediate region DMR are covered with the upper light-shielding layers 231 and 232 each located on a side of the interlayer insulating layer 214X opposite to the semiconductor layer 200.

FIG. 11 is a plan view of a portion near the semiconductor layer 200 of dummy light-shielded units DMC and DMD disposed in the intermediate layer DMR in addition to the light-receiving unit PXL in the light-receiving region PXR and the light-shielded units OBC in the light-shielded region OBR described in the first embodiment. FIG. 12 is a cross-sectional diagram of the light-receiving unit PXL, the dummy light-shielded units DMC and DMD, and the light-shielded units OBC. In the seventh embodiment, the dummy light-shielded unit DMD disposed between the light-receiving unit PXL and the light-shielded unit OBC includes the lower light-shielding layer 109 that covers the charge generation region 102, as in the dummy light-shielded unit DMB according to the second embodiment. The seventh embodiment differs from the first to sixth embodiments in the configurations of the light-receiving unit PXL and the light-shielded units. The light-receiving unit PXL and the light-shielded unit OBC according to the seventh embodiment do not include the charge storage region 105, and consequently do not include the gate electrode 104 serving as the first transfer gate 4 and the lower light-shielding layer 109 that covers the charge storage region 105. The gate electrode 106 serving as the second transfer gate 6 is disposed between the charge generation region 102 and the charge detection region 103. The gate electrode 106 transfers charges from the charge generation region 102 to the charge detection region 103. In addition, the gate electrode 101 serving as the third transfer gate 1 may also be omitted.

The dummy light-shielded units DMC and DMD are disposed between the light-receiving unit PXL and the light-shielded unit OBC. The dummy light-shielded units DMC and DMD are auxiliary pixel units UNT provided to enhance the properties of the light-receiving units PXL and/or the light-shielded units OBC.

The dummy light-shielded units DMC and DMD can be configured so that no signals are obtained therefrom. For example, in the dummy light-shielded units DMC and DMD, neither the amplification transistor 8 nor the selection transistor 9 may be connected to the signal output line 10. Alternatively, even if the dummy light-shielded units DMC and DMD output signals to the signal output line 10, the signals may be excluded from the signals used in signal processing. Alternatively, even if the signals from the dummy light-shielded units DMC and DMD are used in signal processing, the result may be not reflected in the image. Note that if the signals from the dummy light-shielded units DMC and DMD are useful, information based on the signals may be used for the image.

The charge generation region 102 of the dummy light-shielded unit DMD is covered with the lower light-shielding layer 109. The charge generation region 102 of the dummy light-shielded unit DMC is not covered with the lower light-shielding layer 109 just like the light-receiving unit PXL. The dummy light-shielded unit DMC includes the upper light-shielding layer 233, and the dummy light-shielded unit DMD includes the upper light-shielding layer 232. The charge generation region 102 of the dummy light-shielded unit DMC is shielded against light by the upper light-shielding layer 233, and the charge generation region 102 of the dummy light-shielded unit DMD is shielded against light by the upper light-shielding layer 232 and the lower light-shielding layer 109.

Since the dummy light-shielded unit DMD includes the lower light-shielding layer 109, light that enters a portion below the upper light-shielding layer 232 is hindered from entering the semiconductor layer 200. In this way, entry of light to the light-shielded unit OBC through the semiconductor layer 200 is successfully avoided.

In the example illustrated in FIG. 11, the lower light-shielding layer 109 that covers the semiconductor layer 200 in the intermediate region DMR has the opening 191 above the gate electrodes 106, 107, and 108. If the lower light-shielding layer 109 overlaps the gate electrodes 106, 107, and 108, the base of the interlayer insulating layers 214X becomes high by that amount. As a result, the height of the base of the interlayer insulating layers 214X is likely to vary between the light-receiving region PXR and the intermediate region DMR, and the flatness of the interlayer insulating layers 214X reduces. However, since the lower light-shielding layer 109 has the opening 191 above the gate electrodes 106, 107, and 108, the flatness of the interlayer insulating layers 214X increases. In a modification of this example, the lower light-shielding layer 109 may cover not only the charge generation region 102 but also the gate electrodes 106, 107, and 108 in the intermediate region DMR. With such a configuration, the light-shielded degree of the semiconductor layer 200 by the lower light-shielding layer 109 increases.

The dummy light-shielded units DMD and DMC respectively include the upper light-shielding layers 232 and 233 that are disposed farther from the semiconductor layer 200 than the lower light-shielding layer 109. That is, the distances between the upper light-shielding layers 232 and 233 and the semiconductor layer 200 in the dummy light-shielded units DMD and DMC is greater than the distance between the lower light-shielding layer 109 and the semiconductor layer 200 in the light-shielded unit OBC and the dummy light-shielded unit DMD. The upper light-shielding layer 232 is located on a side of the corresponding interlayer insulating layer 214X opposite to the semiconductor layer 200. The upper light-shielding layer 233 shields, against light, the charge generation region 102 of the dummy light-shielded unit DMC not including the lower light-shielding layer 109. In addition, the upper light-shielding layer 232 enhances the light-shielded degree of the charge generation region 102 of the dummy light-shielded unit DMD including the charge generation region 102 covered with the lower light-shielding layer 109.

The upper light-shielding layers 233 and 232 of the dummy light-shielded units DMC and DMD are constituted by the light-shielding film 230 that is continuous to the upper light-shielding layer 231 of the light-shielded unit OBC. By configuring the light-shielding film 230 continuous, that is, not to be sectioned, light that is incident to the charge generation region 102 of the light-shielded unit OBC from a slit formed as a result of sectioning can be eliminated. By disposing the dummy light-shielded units DMC and DMD between the light-receiving unit PXL and the light-shielded unit OBC, the light-shielded unit OBC is successfully disposed farther from the light-receiving unit PXL by the dimensions of the dummy light-shielded units DMD and DMC. Thus, a situation where light that is incident to a portion between the light-shielding film 230 and the semiconductor layer 200 enters the charge generation region 102 of the light-shielded unit OBC is successfully avoided.

The upper light-shielding layer 232 is disposed to be closer to the semiconductor layer 200 than the upper light-shielding layers 231 and 233. That is, the distance between the upper light-shielding layer 232 and the semiconductor layer 200 in the dummy light-shielded unit DMD is less than the distance between the upper light-shielding layer 231 and the semiconductor layer 200 in the light-shielded unit OBC or the distance between the upper light-shielding layer 233 and the semiconductor layer 200 in the dummy light-shielded unit DMC. Such a configuration makes an entrance for light to a portion between the light-shielding film 230 and the semiconductor layer 200 from the light-receiving region PXR narrower, and thus an amount of light that enters the light-shielded region OBR is successfully reduced. As a result, the black-level correction accuracy is successfully increased.

The dielectric region 130 that is surrounded by insulator layers such as the interlayer insulating layers 214X and the diffusion preventing layers 217X and is provided in the light-receiving unit PXL is not disposed above the charge generation region 102 of the dummy light-shielded unit DMD. Thus, the interlayer insulating layers 214X and the diffusion preventing layers 217X cover the charge generation region 102 of the dummy light-shielded unit DMD. Specifically, the interlayer insulating layers 214X and the diffusion preventing layers 217X entirely cover the lower light-shielding layer 109 in the dummy light-shielded unit DMD. Likewise, the dielectric region 130 that is surrounded by insulator layers such as the interlayer insulating layers 214X and the diffusion preventing layers 217X and is provided in the light-shielded unit OBC is not disposed above the charge generation region 102 of the dummy light-shielded unit DMD. Thus, the interlayer insulating layers 214X and the diffusion preventing layers 217X cover the charge generation region 102 of the dummy light-shielded unit DMD between the upper light-shielding layer 232 and the semiconductor layer 200. In addition, the interlayer insulating layers 214X and the diffusion preventing layers 217X entirely cover the lower light-shielding layer 109 in the dummy light-shielded unit DMD.

As described above, by omitting the dielectric region 130 in the dummy light-shielded unit DMD, a possibility of light propagating to the light-shielded unit OBC through the dielectric regions 130 of the pixel units UNT other than the light-receiving units PXL is successfully reduced. This configuration is also considered such that the distance between the adjacent dielectric regions 130 of the light-receiving unit PXL and the light-shielded unit OBC is increased by the dimensions of the pixel units UNT not including the dielectric region 130. It is also considered such that propagation of light from the light-receiving unit PXL to the light-shielded unit OBC is suppressed by placing the light-receiving unit PXL farther from the light-shielded unit OBC.

In the seventh embodiment, not only the dielectric region 130 but also the dielectric material film 133 are omitted in the dummy light-shielded unit DMD. With such a configuration, the possibility of light propagating to the light-shielded unit OBC through the dielectric material film 133 is successfully reduced. In addition, as a result of the omission of the dielectric material film 133 in the dummy light-shielded unit DMD, the upper light-shielding layer 232 is successfully disposed to be closer to the semiconductor layer 200 than the upper light-shielding layer 231 by at least the thickness of the dielectric material film 133. Thus, an amount of light that enters the light-shielded region OBR is successfully reduced.

In the case where the dielectric region 130 is not provided in the dummy light-shielded unit DMD, the dielectric film 110 which serves as the etching stop film may be omitted. In the dummy light-shielded unit DMD in which the lower light-shielding layer 109 covers the charge generation region 102, the dielectric film 110 is omitted. In consideration of a fact that the thickness increases above the charge generation region 102 of the dummy light-shielded unit DMD by the thickness of the lower light-shielding layer 109 compared with the other units as described above, the dielectric film 110 is desirably omitted in the dummy light-shielded unit DMD. In this embodiment, the dielectric film 110 that functions as an antireflection film is disposed above the charge generation region 102 of the dummy light-shielded unit DMC. With such a configuration, light absorption at the charge generation region 102 and light reflection at the surface of the semiconductor layer 200 are successfully suppressed.

As in the light-receiving unit PXL, the dummy light-shielded unit DMC includes the dielectric region 130. The dielectric region 130 of the dummy light-shielded unit DMC may also be referred to as a dummy dielectric region. The distance between the dielectric region 130 of the dummy light-shielded unit DMC and the dielectric region 130 of the light-receiving unit PXL can be made smaller than the distance between the dielectric region 130 of the dummy light-shielded unit DMC and the dielectric region 130 of the light-shielded unit OBC. In this embodiment, the dummy light-shielded unit DMC is adjacent to the light-receiving unit PXL, and the dummy light-shielded unit DMD is located between the dummy light-shielded unit DMC and the light-shielded unit OBC. The distances are implemented in this way. By providing the dielectric region 130 in the dummy light-shielded unit DMC that is disposed to be closer to the light-receiving unit PXL than the dummy light-shielded unit DMD is, a sharp height difference in layers above the interlayer insulating layer 2144 between the light-receiving region PXR and the intermediate region DMR can be avoided. As a result, the flatness of the layers above the intermediate insulating layer 2144 is successfully increased. The layers above the interlayer insulating layer 2144 are the dielectric film 110, the silicon oxynitride layer 228, and the intermediate layer 229. The shape of the dielectric region 130 of the dummy light-shielded unit DMC may be different from the shape of the dielectric regions 130 of the light-receiving unit PXL and the light-shielded unit OBC, as long as the flatness of the layers above the interlayer insulating layer 2144 can be increased. The lower light-shielding layer 109 can be provided below the dielectric region 130 and the dielectric film 110 of the dummy light-shielded unit DMC. However, this configuration makes the height of the base of the dielectric film 110 differ between the dummy light-shielded unit DMC and the light-receiving unit PXL and consequently reduces the flatness of the interlayer insulating layers 214X. Therefore, the lower light-shielding layer 109 is desirably omitted in the dummy light-shielded unit DMC including the dielectric region 130. The dummy light-shielded unit DMC may be disposed in the intermediate region DMR according to the first to sixth embodiments. For example, the dummy light-shielded unit DMC may be disposed between the dummy light-shielded unit DMA and the light-receiving unit PXL according to the second embodiment. When the dummy light-shielded unit DMC is disposed between the dummy light-shielded unit DMC and the light-receiving unit PXL according to the second embodiment, the resultant intermediate region DMR is similar to the intermediate region DMR of the seventh embodiment.

Although the description has been given of the example where each of the dummy light-shielded units DMC and DMD in the intermediate region DMR includes the charge generation region 102, the charge generation region 102 may be omitted because no signal is read from the dummy light-shielded units DMC and DMD. In such a case, the intermediate region DMR is merely required to be covered with the lower light-shielding layer 109 located between the interlayer insulating layers 214X and the semiconductor layer 200 over an area that is greater than an area of the charge generation region 102 of the light-receiving unit PXL and the light-shielded unit OBC. With such a configuration, advantages similar to those of the case of including the charge generation region 102 are provided even if the charge generation region 102 is not present in the intermediate ration DMR. Since two or three dummy light-shielded units DMD are disposed in this example, the intermediate region DMR is covered with the lower light-shielding layer 109 over an area that is more than twice or three times as large as the area of the charge generation region 102. Note that, in the second embodiment, an area of the charge storage region 105 is larger than an area of the charge generation region 102. So, in the dummy light-shielded unit DMA in which the lower light-shielding layer 109 has the opening 190, the semiconductor layer 200 is also covered by the lower light-shielding layer 109, over an area that is greater than an area of the charge generation region 102. Therefore, not only in the dummy light-shielded unit DMB but also in the dummy light-shielded unit DMA, the advantage of covering the semiconductor layer 200 with the lower light-shielding layer 109, may be provided.

Eighth Embodiment

A configuration other than that of the pixel units UNT of the photoelectric conversion apparatus IS will be described with reference to FIG. 1A. The photoelectric conversion apparatus IS can include a peripheral circuit PRC (not illustrated). The peripheral circuit PRC can include a vertical drive circuit VDC for driving the plurality of pixel units UNT, a signal processing circuit SPC for processing signals obtained from the plurality of pixel units UNT, and a horizontal scan circuit HSC for sequentially outputting the signals processed by the signal processing circuit SPC. The peripheral circuit PRC can include an output circuit OPC for outputting a signal generated by the signal processing circuit SPC. The peripheral circuit PRC can include a control circuit CC for controlling the vertical drive circuit VDC, the signal processing circuit SPC, and the horizontal scan circuit HSC. The signal processing circuit SPC can include an analog/digital converter, and the control circuit CC can include a timing generator. The vertical drive circuit VDC and the horizontal scan circuit HSC can include a shift register and an address decoder. The output circuit OPC can include an LVDS driver. The peripheral circuit PRC can be disposed in the peripheral region PRR located in the vicinity of the pixel units UNT in the semiconductor chip IC. Note that at least one of the vertical drive circuit VDC, the signal processing circuit SPC, the horizontal scan circuit HSC, the control circuit CC, and the output circuit OPC can be mounted on a semiconductor chip different from the semiconductor chip having the plurality of pixel units UNT. The semiconductor chip and the semiconductor chip having the plurality of pixel units UNT may be stacked.

The image pickup system SYS illustrated in FIG. 1B can be an electronic device, such as an information terminal having a camera and an image capturing function. In addition, the image pickup system SYS can be a transport apparatus, such as a vehicle, ship, or an aircraft. The image pickup system SYS that is a transport apparatus is suitably used for transporting the photoelectric conversion apparatus IS or for assisting or automating driving (operation) using the image capturing function.

The photoelectric conversion apparatus IS can further include a package PKG containing the semiconductor chip IC in addition to the semiconductor chip IC. The package PKG can include a base body to which the semiconductor chip IC is fixed, a rid of a glass or the like that opposes the semiconductor layer 200, and connection members such as bonding wires and bumps for connecting terminals of the base body to the terminals of the semiconductor chip IC.

The optical system OU forms an image on the photoelectric conversion apparatus IS and includes, for example, a lens, a shutter, and a mirror. The control device CU controls the photoelectric conversion apparatus IC and may be, for example, a semiconductor device such as an application specific integrated circuit (ASIC). The processing device PU processes signals output from the photoelectric conversion apparatus IS and may be, for example, a semiconductor device for constituting an analog frontend (AFE) or digital frontend (DFE), such as a central processing unit (CPU) or ASIC. The display device DU is an electroluminescence (EL) display device or liquid crystal display device that displays an image captured by the photoelectric conversion apparatus IS. The memory device MU stores an image obtained by the photoelectric conversion apparatus IS and is, for example, a volatile memory such as a static random access memory (SRAM) or dynamic RAM (DRAM) or a nonvolatile memory such as a flash memory or hard disk drive.

As described above, each of the embodiments relates to the photoelectric conversion apparatus IS including the plurality of pixel units each including the charge generation region 102 disposed in the semiconductor layer 200. The light-receiving units PXL and the light-shielded units OBA among the plurality of pixel units include the charge storage region 105 that stores charges transferred thereto from the charge generation region 102. The light-receiving units PXL and the light-shielded units OBA include the dielectric region 130 located above the charge generation region 102 and surrounded by insulator layers such as the interlayer insulating layers 214X and the diffusion preventing layers 217X. The light-receiving units PXL and the light-shielded units OBA include the lower light-shielding layer 109 covering the charge storage region 105 between the interlayer insulating layers 214X and the semiconductor layer 200 and having the opening 190 above the charge generation region 102. The charge generation region 102 of the light-receiving units PXL receives light through the opening 190, and the charge generation region 102 of the light-shielded units OBA is covered with the upper light-shielding layer 231. In this way, the photoelectric conversion apparatus IS capable of obtaining a signal of good quality can be provided.

In an intermediate region DMR located between the light-receiving unit PXL and the light-shielded units OBA, the semiconductor layer 200 is covered with the lower light-shielding layer 109 located between the interlayer insulating layers 214X and the semiconductor layer 200, and an area of the semiconductor layer 200 covered with the lower light-shielding layer 109 is greater than an area of the charge generation region 102. The intermediate region DMR and the charge generation region 102 of the light-shielded units OBA are covered with the upper light-shielding layer 231 located on a side of the interlayer insulating layers 214X opposite to the semiconductor layer 200. In this way, the photoelectric conversion apparatus IS capable of obtaining a signal of good quality can be provided.

The embodiments described above can be appropriately modified within the scope not departing from the spirit of the present invention. Note that content disclosed by this specification includes items that are not explicitly written in the specification but can be read from the accompanying drawings as well as items explicitly written in the specification.

According to the embodiments, photoelectric conversion apparatuses capable of obtaining a signal of good quality can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2016-212128, filed Oct. 28, 2016, and No. 2017-194427, filed Oct. 4, 2017, which are hereby incorporated by reference herein in their entirety.

What is claimed is:

1. A photoelectric conversion apparatus comprising:
a plurality of units each including a charge generation region disposed in a semiconductor layer,
wherein each of a first unit of the plurality of units and a second unit of the plurality of units includes
a charge storage region configured to store charges transferred from charge generation region to the charge storage region;
a first wiring layer located above the semiconductor layer;
a second wiring layer located above the semiconductor layer;
an insulator layer located between the first wiring layer and the second wiring layer;
a dielectric region located above the charge generation region and surrounded by the insulator layer, a material of the dielectric region being different from a material of the insulator layer; and
a first light-shielding layer located between the insulator layer and the semiconductor layer, the first light-shielding layer covering the charge storage region, and the first light-shielding layer having an opening located above the charge generation region, and
wherein the first unit is configured so that the charge generation region of the first unit is able to receive light through the opening of the first light-shielding layer, and
the charge generation region of the second unit is covered with a second light-shielding layer.

2. The photoelectric conversion apparatus according to claim 1, wherein a main constituent of the first wiring layer and the second wiring layer is copper.

3. The photoelectric conversion apparatus according to claim 2, wherein the dielectric region constitutes, together with the insulator layer, a light-guiding path.

4. The photoelectric conversion apparatus according to claim 1, wherein the insulator layer contains silicon, and at least one of nitrogen and carbon, and/or wherein the dielectric region contains silicon, nitrogen, and hydrogen.

5. The photoelectric conversion apparatus according to claim 1, wherein in the first unit and the second unit, a distance between the charge storage region and the first light-shielding layer is less than a distance between the dielectric region and the charge generation region.

6. The photoelectric conversion apparatus according to claim 1, wherein in the first unit and the second unit, a dielectric film is disposed between the dielectric region and the charge storage region and extends between the insulator layer and the first light-shielding layer.

7. The photoelectric conversion apparatus according to claim 1,
wherein the dielectric region is located between an inorganic material layer and the semiconductor layer in the first unit, and
wherein the inorganic material layer is located between the second light-shielding layer and the dielectric region in the second unit.

8. The photoelectric conversion apparatus according to claim 1, wherein in the first unit and the second unit, the dielectric region has a width that is greater than a width of the opening.

9. The photoelectric conversion apparatus according to claim 2, wherein the first light-shielding layer has another opening, a shape of the another opening being different from a shape of the opening located above the charge generation region, and a plurality of contact plugs are disposed in the other opening.

10. The photoelectric conversion apparatus according to claim 2,
wherein each of the first unit and the second unit includes
a charge detection region configured to detect charges transferred from the charge storage region to the charge detection region,
a first transfer gate configured to transfer charges from the charge generation region to the charge storage region,
a second transfer gate configured to transfer charges from the charge storage region to the charge detection region, and
an amplification transistor connected to the charge detection region, and
wherein in the first unit and the second unit, the first light-shielding layer covers the first transfer gate and the second transfer gate.

11. The photoelectric conversion apparatus according to claim 2,
wherein a third unit is disposed between the first unit and the second unit,
wherein the third unit includes a third light-shielding layer and a fourth light-shielding layer,
wherein the third light-shielding layer has an opening, and the fourth light-shielding layer covers the opening of the third light-shielding layer; and
wherein the insulator layer extends between the third light-shielding layer and the fourth light-shielding layer, and the insulator layer covers the entire opening of the third light-shielding layer.

12. The photoelectric conversion apparatus according to claim 1,
wherein a fourth unit is disposed between the first unit and the second unit,
wherein the fourth unit includes a fourth light-shielding layer, and
wherein a distance between the fourth light-shielding layer and the semiconductor layer is greater than a distance between the first light-shielding layer and the semiconductor layer in the second unit, and is less than a distance between the second light-shielding layer and the semiconductor layer in the second unit.

13. The photoelectric conversion apparatus according to claim 12, wherein the second light-shielding layer and the fourth light-shielding layer are constituted by a continuous light-shielding film.

14. The photoelectric conversion apparatus according to claim 1,
wherein a fifth unit of the plurality of units includes
a charge storage region configured to store charges transferred from the charge generation region of the fifth unit to the charge storage region of the fifth unit,
a dielectric region located above the charge generation region of the fifth unit and surrounded by the insulator layer, and
a fifth light-shielding layer covering between the insulator layer and the semiconductor layer, the charge storage region of the fifth unit, and the fifth light-shielding layer covering, between the dielectric region and the semiconductor layer, the charge generation region.

15. The photoelectric conversion apparatus according to claim 1,
wherein a sixth unit of the plurality of units includes
a charge storage region configured to store charges transferred from the charge generation region of the sixth unit to the charge storage region of the sixth unit, and
a sixth light-shielding layer covering, between the insulator layer and the semiconductor layer, the charge storage region of the sixth unit, and the sixth light-shielding layer having an opening above the charge generation region of the sixth unit, and wherein in the sixth unit, the insulator layer covers the entire opening of the sixth light-shielding layer and the charge generation region of the sixth unit receives light through the opening.

16. A photoelectric conversion apparatus comprising:
a first unit and a second unit,
wherein each of the first unit and the second unit includes:
   a first impurity region of n-type disposed in a semiconductor layer;
   a second impurity region of n-type disposed in the semiconductor layer;
   a third impurity region of n-type disposed in the semiconductor layer;
   a first gate electrode for transferring charges from the first impurity region to the second impurity region;
   a second gate electrode for transferring charges from the second impurity region to the third impurity region;
   a dielectric region located above the first impurity region and surrounded by an insulator layer, a material of the dielectric region being different from a material of the insulator layer; and
   a first light-shielding layer located between the insulator layer and the semiconductor layer, the first light-shielding layer covering the second impurity region, and the first light-shielding layer having a first type opening and a second type opening, the first type opening being located above the first impurity region, a shape of the second type opening being different from a shape of the first type opening,
wherein the first unit is configured so that the first impurity region of the first unit is able to receive light through the first type opening of the first shielding layer,
wherein the second unit is configured so that the first impurity region of the second unit is covered with a second light-shielding layer, and
wherein a contact plug on the second gate electrode and a contact plug on the third impurity region are disposed in the second type opening.

17. A photoelectric conversion apparatus comprising:
a plurality of units each including a charge generation region disposed in a semiconductor layer,
wherein each of a first unit and a second unit of the plurality of units includes
   a charge detection region configured to detect charges transferred from the charge generation region to the charge detection region;
   a first wiring layer above the semiconductor layer;
   a second wiring layer above the semiconductor layer;
   an insulator layer located between a first wiring layer and a second wiring layer; and
   a dielectric region located above the charge generation region and surrounded by an insulator layer, a material of the dielectric region being different from a material of the insulator layer,
wherein in an intermediate region located between the first unit and the second unit, the semiconductor layer is covered with a first light-shielding layer located between the insulator layer and the semiconductor layer, and an area of the semiconductor layer covered with the first light-shielding layer is greater than an area of the charge generation region, and wherein the charge generation region of the second unit and the intermediate region are covered with a second light-shielding layer located on to the semiconductor layer,
wherein the first wiring layer and the second wiring layer located between the first light-shielding layer and the second light-shielding layer, and
wherein a main constituent of the first light-shielding layer is different from a main constituent of the first wiring layer, and a main constituent of the second light-shielding layer is different from a main constituent of the second wiring layer.

18. The photoelectric conversion apparatus according to claim 17,
wherein a dummy dielectric region surrounded by the insulator layer is disposed between the second light-shielding layer and the semiconductor layer, and
wherein a distance between the dummy dielectric region and the dielectric region of the first unit is less than a distance between the dummy dielectric region and the dielectric region of the second unit.

19. The photoelectric conversion apparatus according to claim 1,
wherein a main constituent of the first light-shielding layer is different from a main constituent of the first wiring layer, and
wherein a main constituent of the second light-shielding layer is different from a main constituent of the second wiring layer.

20. The photoelectric conversion apparatus according to claim 16,
wherein the insulator layer is located between a first wiring layer and a second wiring layer,
wherein a main constituent of the first light-shielding layer is tungsten,
wherein a main constituent of the second light-shielding layer is aluminum, and
wherein a main constituent of the first wiring layer and the second wiring layer is aluminum.

21. The photoelectric conversion apparatus according to claim 16, wherein the dielectric region is located between the second light-shielding layer and the first impurity region in the second unit.

22. A system comprising:
the photoelectric conversion apparatus according to claim 1, the photoelectric conversion apparatus including a glass rid which opposes the semiconductor layer; and
at least one of
an optical system configured to form an image on the photoelectric conversion apparatus;
a control device configured to control the photoelectric conversion apparatus;
a processing device configured to process a signal output from the photoelectric conversion apparatus;
a display device configured to display information obtained by the photoelectric conversion apparatus; and
a memory device configured to store information obtained by the photoelectric conversion apparatus.

23. The photoelectric conversion apparatus according to claim 16, wherein the first unit includes a color filter (250), and the dielectric region of the first unit is located between the first impurity region of the first unit and the color filter.

24. The photoelectric conversion apparatus according to claim 16, wherein a third unit is disposed between the first unit and the second unit, wherein the third unit includes a third light-shielding layer and a fourth light-shielding layer, wherein the third light-shielding layer has a first opening, and a shape of the first opening is more similar to the shape of the first type opening than to the shape of the second type opening, and wherein the fourth light-shielding layer covers the first opening, the insulator layer extends between the third light-shielding layer and the fourth light-shielding layer, and the insulator layer covers the entire first opening.

25. The photoelectric conversion apparatus according to claim 24, wherein the first light-shielding layer and the third light-shielding layer are constituted by a first continuous light-shielding film, and the second light-shielding layer and the fourth light-shielding layer are constituted by a second continuous light-shielding film.

26. The photoelectric conversion apparatus according to claim 16, wherein each of the first unit and the second unit includes another impurity region to which a power supply voltage is supplied, and wherein a contact plug on the another impurity region is disposed in the second type opening.

27. The photoelectric conversion apparatus according to claim 16, wherein each of the first unit and the second unit includes a reset transistor connected to the third impurity region, and wherein a contact plug on a gate electrode of the reset transistor is disposed in the second type opening.

28. The photoelectric conversion apparatus according to claim 16, wherein each of the first unit and the second unit includes,
a fourth impurity region of n-type disposed in the semiconductor layer, and
a third gate electrode for transferring charges from the first impurity region to the fourth impurity region,
wherein the first light-shielding layer has a third type opening, a shape of the third type opening being different from a shape of the first type opening, and
wherein a contact plug on the third gate electrode and a contact plug on the fourth impurity region are disposed in the third type opening.

29. A system comprising:
the photoelectric conversion apparatus according to claim 2; and
at least one of an optical system configured to form an image on the photoelectric conversion apparatus;
a control device configured to control the photoelectric conversion apparatus;
a processing device configured to process a signal output from the photoelectric conversion apparatus;
a display device configured to display information obtained by the photoelectric conversion apparatus; and
a memory device configured to store information obtained by the photoelectric conversion apparatus.

30. A system comprising:
the photoelectric conversion apparatus according to claim 16; and
at least one of
an optical system configured to form an image on the photoelectric conversion apparatus;
a control device configured to control the photoelectric conversion apparatus;
a processing device configured to process a signal output from the photoelectric conversion apparatus;
a display device configured to display information obtained by the photoelectric conversion apparatus; and
a memory device configured to store information obtained by the photoelectric conversion apparatus.

31. A transport apparatus which is a vehicle, a ship or an aircraft comprising:
a plurality of units each including a charge generation region disposed in a semiconductor layer; and
a processing device processing a signal based on an output from the plurality of units,
wherein each of a first unit of the plurality of units and a second unit of the plurality of units includes:
a charge storage region configured to store charges transferred from the charge generation region to the charge storage region;
a first wiring layer located above the semiconductor layer;
a second wiring layer located above the semiconductor layer;
an insulator layer located between the first wiring layer and the second wiring layer;
a dielectric region located above the charge generation region and surrounded by the insulator layer, a material of the dielectric region being different from a material of the insulator layer, and
a first light-shielding layer located between the insulator layer and the semiconductor layer, the first light-shielding layer covering the charge storage region, and the first light-shielding layer having an opening located above the charge generation region, and
wherein the first unit is configured so that the charge generation region of the first unit is able to receive light through the opening of the first light-shielding layer, and
the charge generation region of the second unit is covered with a second light-shielding layer.

32. The transport apparatus according to claim 31, wherein the signal is used for assisting or automating driving of the transport apparatus.

* * * * *